(12) United States Patent
Cheung et al.

(10) Patent No.: US 6,369,610 B1
(45) Date of Patent: Apr. 9, 2002

(54) RECONFIGURABLE MULTIPLIER ARRAY

(75) Inventors: Peter Ying Kay Cheung, Southgate; Simon Dominic Haynes, Horsham, both of (GB)

(73) Assignee: IC Innovations Ltd., London (GB)

( * ) Notice: Subject to any disclaimer, the term of this patent is extended or adjusted under 35 U.S.C. 154(b) by 0 days.

(21) Appl. No.: 09/582,541

(22) PCT Filed: Dec. 23, 1998

(86) PCT No.: PCT/GB98/03902

§ 371 Date: Oct. 10, 2000

§ 102(e) Date: Oct. 10, 2000

(87) PCT Pub. No.: WO99/34514

PCT Pub. Date: Jul. 8, 1999

(30) Foreign Application Priority Data

Dec. 29, 1997 (GB) .............................................. 9727414

(51) Int. Cl.[7] .......................... G06F 7/38; H01L 25/00; H03K 19/177
(52) U.S. Cl. .......................... 326/41; 326/39; 708/505; 708/670
(58) Field of Search .............................. 326/38, 39, 40, 326/41; 708/505, 670

(56) References Cited

U.S. PATENT DOCUMENTS

| 5,448,186 | A |   | 9/1995  | Kawata |         |
|-----------|---|---|---------|--------|---------|
| 5,570,039 | A |   | 10/1996 | Oswald et al. |  |
| 5,777,915 | A | * | 7/1998  | Witte et al. ............. | 364/754.01 |
| 5,787,031 | A | * | 7/1998  | Ichikawa et al. ............ | 364/764 |
| 5,805,477 | A | * | 9/1998  | Perner ................... | 364/716.03 |
| 5,909,385 | A | * | 6/1999  | Nishiyama et al. .... | 364/760.03 |
| 5,914,892 | A | * | 6/1999  | Wang et al. ................. | 364/758 |
| 6,130,553 | A | * | 10/2000 | Nakaya ........................ | 326/39 |
| 6,140,839 | A | * | 10/2000 | Kaviani et al. ............... | 326/39 |
| 6,154,049 | A | * | 11/2000 | New ............................ | 326/39 |

FOREIGN PATENT DOCUMENTS

EP          668 659 A2        8/1995

OTHER PUBLICATIONS

"Configurable Multiplier Blocks for embedding in FPGAs" by Haynes, et al., *Electronic Letters* 34, Apr. 2, 1998, No. 7, Stevenage, Harts GB.

* cited by examiner

*Primary Examiner*—Michael Tokar
*Assistant Examiner*—Vibol Tan
(74) *Attorney, Agent, or Firm*—Calfee, Halter & Griswold, LLP

(57) ABSTRACT

This invention provides a logic block comprising an mxn array of partial calculating circuits (where $m \geq 2$ and $n \geq 2$) operable to generate partial product components of an m-bit multiplicand x n-bit multiplicand binary multiplication and to generate a cumulative sum of the partial products for each bit of one of the multiplicands. A configurable output circuit which is operable under the control of a configuration signal either (a) to sum the cumulative sums of partial products generated by the partial calculating circuits so as to generate a product value, or (b) to pass data representing the cumulative sums of the partial product components to partial calculating circuits within one or more further logic blocks. Also provided is a logic circuit including two or more such logic blocks, data interconnections for data transfer between the logic blocks and control interconnections for control signal transfer to the logic blocks.

6 Claims, 22 Drawing Sheets

```
                                    14
        0 1 1 1 0                   -13
        1 0 0 1 1   *   1 1 0 0 1   LSB
        ─────────       ─────────
        0 1 1 1 0       0 1 1 1 0
        0 1 1 1 0       0 1 1 1 0
        0 0 0 0 0       0 0 0 0 0
        0 0 0 0 0       0 0 0 0 0
        0 0 0 0 1       10 1 1 1   ← -MSB (INVERT ALL BITS + 1)
                          ↑                                  +1
  0 ⊕ 1                 CARRYS
    ↓
    1 1 1 1 0 0 1 0 1 0             = -182
```

SIGNED BINARY MULTIPLICATION

FIG. 4

```
                                    10
        0 1 0 1 0                   25
        1 1 0 0 1   *   1 1 0 0 1   LSB
        ─────────
        0 1 0 1 0
        0 0 0 0 0
        0 0 0 0 0
        0 1 0 1 0
        0 1 0 1 0                   MSB
        ─────────────
        0 0 1 1 1 1 1 0 1 0         = 250
```

UNSIGNED BINARY MULTIPLICATION

RECONFIGURABLE MULTIPLIER ARRAY

RELATED APPLICATIONS

This application is a National Stage application under 35 U.S.C. §371 of International Application No. PCT/GB/03902, which both designated and elected the United States, and claims priority to Great Britain Patent Application No. 9727414.6, filed Dec. 29, 1997.

FIELD OF THE INVENTION

This invention relates to logic circuits, such as so-called field programmable gate arrays (FPGAs) or so-called complex programmable logic devices (CLDs) and to functional logic blocks within such circuits.

BACKGROUND OF THE INVENTION

FPGAs are integrated circuits containing a very large number of logic gates organised as an array, with the interconnections between the logic gates and the function of the gates themselves being controllable or configurable via externally programmed control circuitry. In this way, an FPGA can be adapted, after fabrication, to perform a number of different tasks simply by changing the settings provided by the externally programmed control circuitry.

FPGAs are particularly useful because of their relatively low cost and short design times in comparison with bespoke integrated circuits.

It has been suggested that FPGAs are well suited for use as reconfigurable hardware to accelerate software in many applications [see publication reference 1 below]. Image or video processing tasks are particularly well suited to hardware acceleration, because of the inherent parallelism and data flow structure. Common to many image and video processing tasks is the need for intensive arithmetic operations such as multiplication and addition.

Whilst existing FPGA architectures are well suited to binary addition [2], configuring FPGAs for binary multiplication results in the available reconfigurable resources being used inefficiently [3]. Typically over 70% of the FPGA could be required solely for multiplication in some applications. The literature also suggests that hardware implemented on an FPGA requires as much as 100 times more die area, and will be about 10 times slower than the bespoke hardware equivalent [4].

Hwang has suggested constructing Universal Multiplication Networks using small (4 bit) programmable Additive Multiply (PAM) modules [5]. Whilst simple in design, these networks have the drawback of slow multiplication times and a non-scalable connection pattern, especially for large operand sizes.

Most other multiplier architectures are concerned with the multiplication of two multiplicands of fixed length. The techniques used for speeding us the multiplication are largely at the expense of regularity, such as Wallace Trees [6], or require some form of "pre-processing" of the operands, e.g. Booth's Modified algorithm [7]. Neither of these styles of design is well suited to generalisation for multiplicands of variable size, thus making it difficult to create a reconfigurable multiplier based on these methods.

So, there is a need for a field programmable or configurable logic circuit or circuit element (e.g. as a part of a larger FPGA) which can be used efficiently to carry out multiplication operations.

SUMMARY OF THE INVENTION

This invention provides a logic block comprising:

an m×n array of partial calculating circuits (where m≧2 and n≧2) operable to generate partial product components of an m-bit multiplicand x n-bit multiplicand binary multiplication and to generate a cumulative sum of the partial products for each bit of one of the multiplicands; and a configurable output circuit operable, under the control of a configuration signal, either:
   (a) to sum the cumulative sums of partial products generated by the partial calculating circuits so as to generate a product value; or
   (b) to pass data representing the cumulative sums of the partial product components to partial calculating circuits within one or more further logic blocks.

Embodiments of the invention can provide FPGAs combined with reconfigurable multipliers. A design is presented for a reconfigurable multiplier array, constructed using an array of 4 bit flexible array blocks (FABs) which has speed comparable to that of a conventional signed array multiplier, with minimal extra cost in hardware required for reconfiguration. The multiplier can be configured to perform both unsigned, and signed two's complement multiplication.

The logic block can be used to generate simply an m-bit by n-bit product, or in alternative preferred embodiments plural logic blocks can be linked together to form a composite multiplier capable of handling larger multiplicands.

Because the logic blocks are relatively self-contained and so require very little configuration data, there can be a dramatic reduction in the administrative overhead usually needed to configure a gate array to perform large multiplications.

Other respective aspects and features of the invention are defined in the appended claims.

BRIEF DESCRIPTION OF THE DRAWINGS

The invention will now be described by way of example with reference to the accompanying drawings, throughout which like parts are referred to by like references, and in which:

FIG. 4 illustrates a binary multiplication process;

DETAILED DESCRIPTION

In the following description, a design for a flexible array block (FAB) is presented. An explanation of how an array of FABs can be used to create a 4n×4m multiplier is given, followed by a proof of the functionality of the proposed design. The FAB scheme is then compared to existing fixed size multipliers, the Hwang reconfigurable multiplier, and multipliers implemented using FPGAs. A possible modification to the FAB scheme is then discussed, to allow simple implementation of multiplier accumulators and FIR filters.

The Design of the Flexible Array Block (FAB)

Figure 1A:
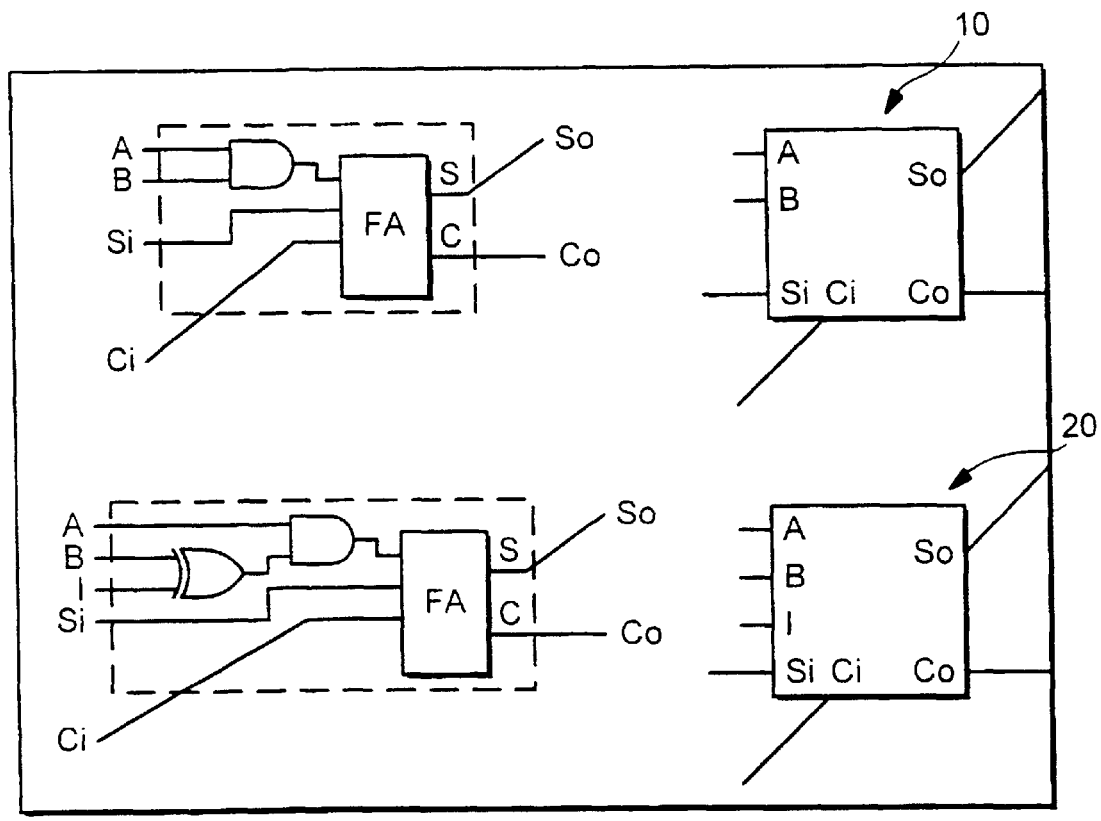
FIGS. 1a and 1b schematically illustrate some "building blocks" used in the description of a flexible array block (FAB)
Figure 1B:
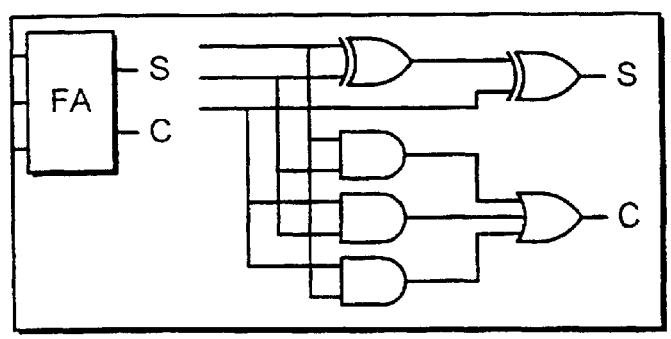

FIGS. 1a and 1b schematically illustrate some "building blocks" used in an FAB.

FIG. 1a illustrates two functional units 10, 20 formed of a full-adder and associated logic gates. For completeness, a logic circuit diagram of a full adder is provided in FIG. 1b.

Figure 2:
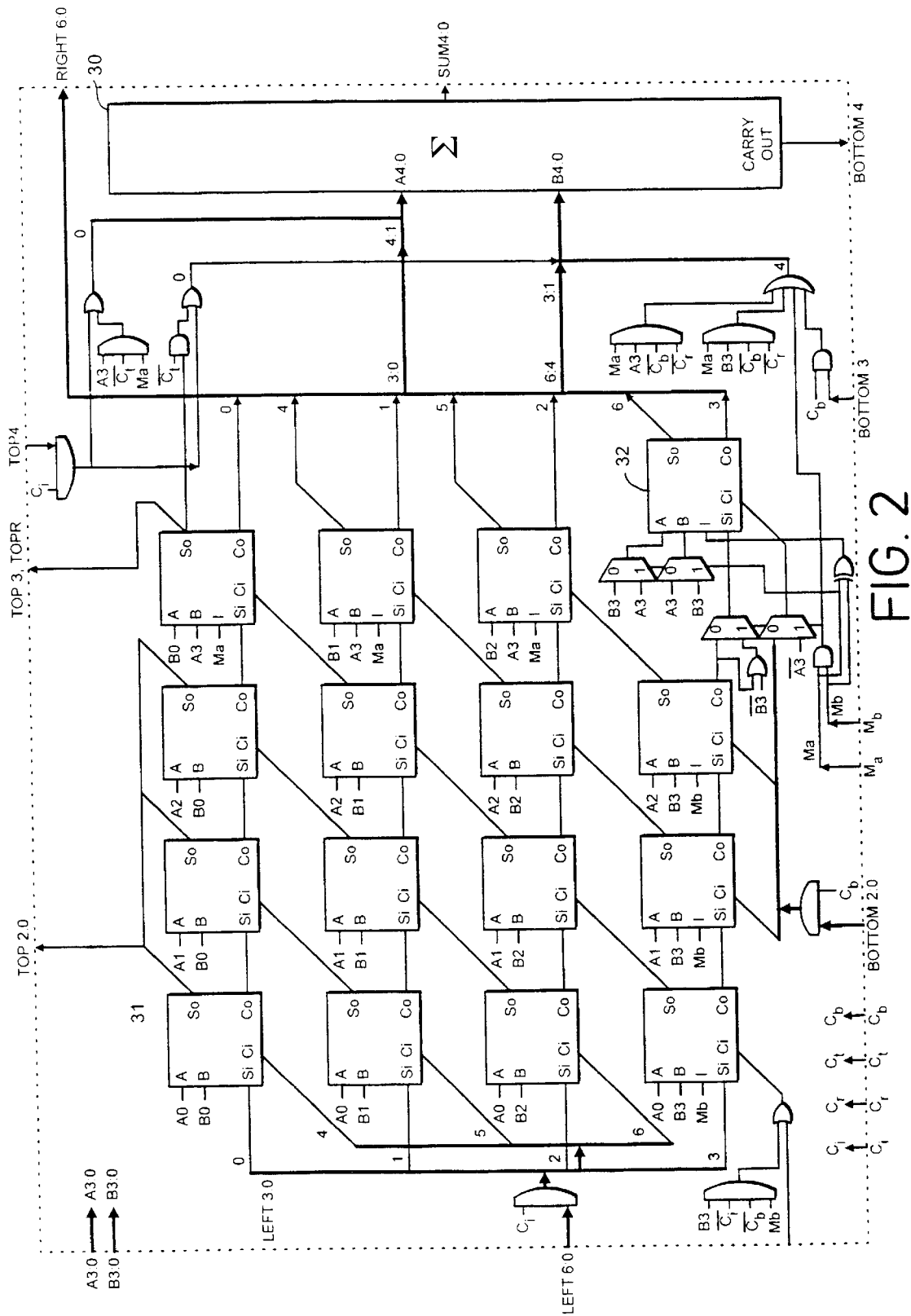
FIG. 2 is a schematic diagram of a 4×4 FAB.

FIG. 2 schematically illustrates a 4×4 flexible array block (FAB) formed of a number of the functional units 10, 20, further associated logic gates and an adder 30.

The FAB uses a modification of the array developed by Baugh-Wooley for two's complement multiplication [8]. The FAB consists of two parts: i) a multiplier array which reduces the four bit multiplication of two 5 bit numbers, and ii) the adder 30 to produce the final output.

In use, the FABs are organised into arrays of FABs. This approach will be described further below. The adder 30 in an individual FAB is unused unless the FAB is in the last column of overall FAB array (i.e. it uses the most significant bit of the multiplicand A).

Each FAB is configured using the six configuration bits $M_a$, $M_b$, $C_l$, $C_r$, $C_t$, and $C_b$ as shown in table I. The configuration of each FAB will be denoted by $FAB_{(Ma,Mb,Cl,Cr,Ct,Cb)}$. The configuration determines which input signals are responded to by an FAB. So, although all of the inputs are permanently connected to other FABs or buses within an FPGA, whether an individual FAB responds to a particular input is determined by the configuration state of the FAB.

The operation of the FAB will be described further below, both in general terms and in conjunction with mathematical proofs.

TABLE I

CONFIGURATION SETTINGS FOR
THE FLEXIBLE MULTIPLIER BLOCK

| Bit | Meaning |
|---|---|
| Ma | High if A3 is the MSB of a signed number |
| Mb | High if B3 is the MSB of a signed number |
| Cl | High if A0 is not the LSB of the multiplicand A (the FAB is connected to the FAB on the left) |
| Cr | High if A3 is not the MSB of the multiplicand A (the FAB is connected to the FAB on the right) |
| Cb | High if B3 is not the MSB of the multiplicand B (the FAB is connected to the FAB on the bottom) |
| Ct | High if B0 is not the LSB of the multiplicand B (the FAB is connected to the FAB on the top) |

Figure 3:
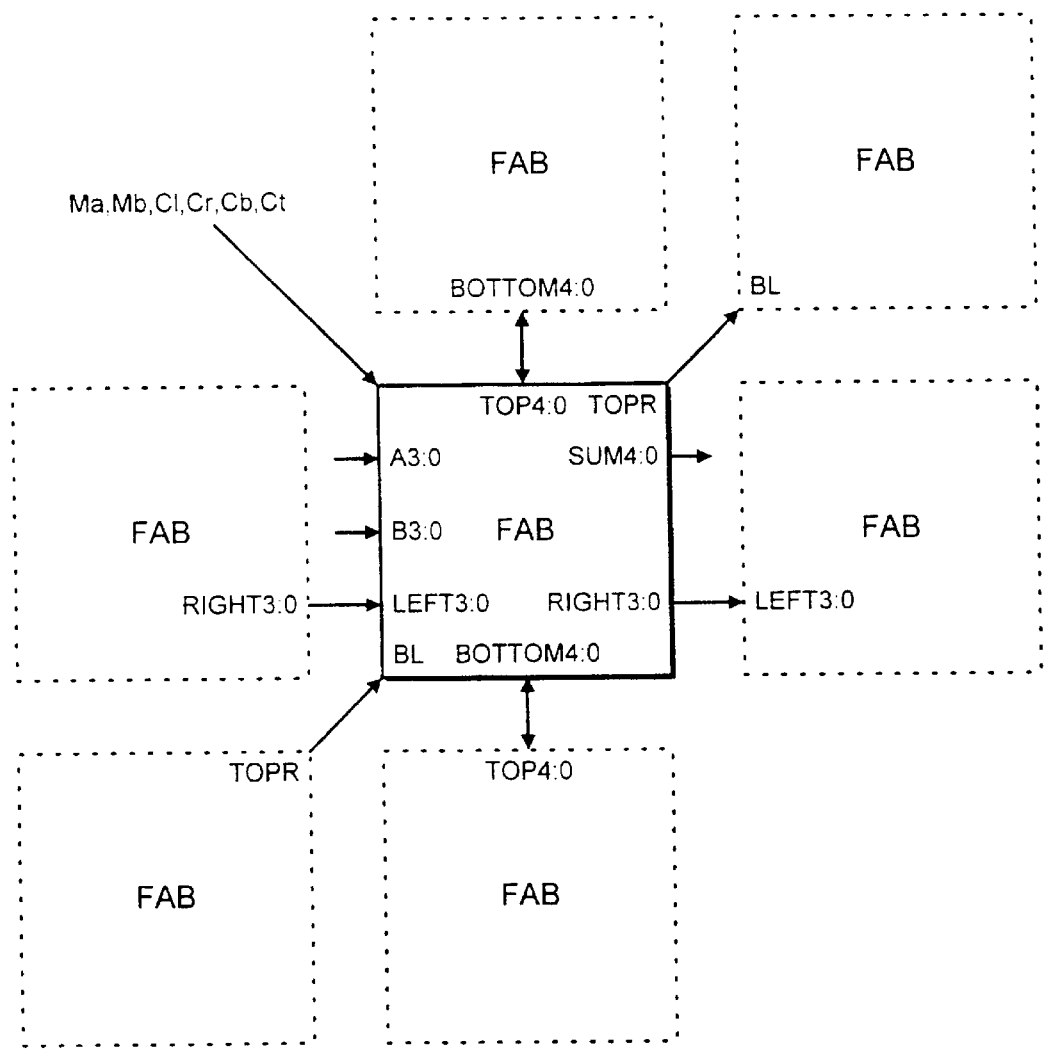
FIG. 3 is a schematic diagram illustrating the required interconnection of an array of FABs.

FIG. 3 shows a general connection scheme for the FABs. The interconnection arrangement is both regular and scalable, allowing simple VLSI implementation and expansion to larger array sizes.

Each FAB within an array is interconnected to receive signals from the FABs above, below, to the left and to the bottom left with respect to the position of that FAB. The FAB outputs signals to other FABs at positions above, above right, below and right of that FAB. The configuration information (M . . . , C . . . ) is supplied separately.

Such an array of FABs can be configured to perform a number of multiplications, with multiplicands of varying sizes. For example, a 4×4 array of 4×4 FABs is capable of performing a single 16×16 bit multiplication, or 16 4×4 bit multiplication (unsigned, or two's complement in either case).

To configure the array, the six configuration bits of each FAB must be set appropriately, the correct multiplicands supplied to each FAB, and the output(s) taken from the appropriate place.

FIG. 4 schematically illustrates a binary multiplication process.

In the left-hand example, two five bit unsigned numbers are multiplied. This involves multiple "shift and add" operations, so that for each bit of a first multiplicand, the other multiplicand is shifted in a more significant direction. If the bit of the first multiplicand is 1, the shifted version of the other multiplicand is added so as to contribute to the product. This is a well-used technique.

The right-hand example shows a similar method for use with two's complement (signed) binary numbers. It is similar except that on the last row of the addition (i.e. multiplication by the MSB) the bits are all inverted and 1 is added. Again, this is standard two's complement arithmetic.

The FAB of FIG. 2 mirrors the arithmetic of FIG. 4. Comparing the two figures, a functional unit 31 calculates a partial product (A0.B0) corresponding to the product of the two LSBs, and a functional unit 32 calculates the partial product (A3.B3) corresponding to the product of the two MSBs. The remaining functional units calculate respective partial products (e.g. A2.B1) between these extremes.

Each functional unit can receive data from other functional units so that cumulative sums of the partial products are generated. These correspond to summing operations down respective columns of the calculation of FIG. 4.

The adder 30 adds all of the cumulative sums of partial products to create the 4×4 bit product.

The FAB can pass the output of the functional units to subsequent FABs (e.g. using the signals TOP and RIGHT), and can receive the output of functional units of preceding FABs (e.g. by the inputs LEFT and BOTTOM). In this way, multiple FABs can be linked together to form (effectively) a seamless array of the functional units, operating as a scaled-up version of the 4×4 array of functional units within a single FAB. If multiple FABs are joined in this way, the adders are not used in FABs other than those on the extreme right hand column of the array of FABs.

In the case of two's complement arithmetic, if one or both of the multiplicands is signed then the bits to be multiplied by the MSB of the other multiplicand can be inverted, and one added, using the additional logic present in the functional units 20 (used in the bottom row and right hand column of the FAB), and 1 can be added to the output when necessary using the additional logic associated with the functional unit 32. This feature is under the control of control bits $M_a$ (to cause the right hand column to operate as for signed arithmetic) and $M_b$ (to cause the bottom row to operate as for signed arithmetic). In this way, products with one or both of the multiplicands being signed can be accommodated.

Figure 5:
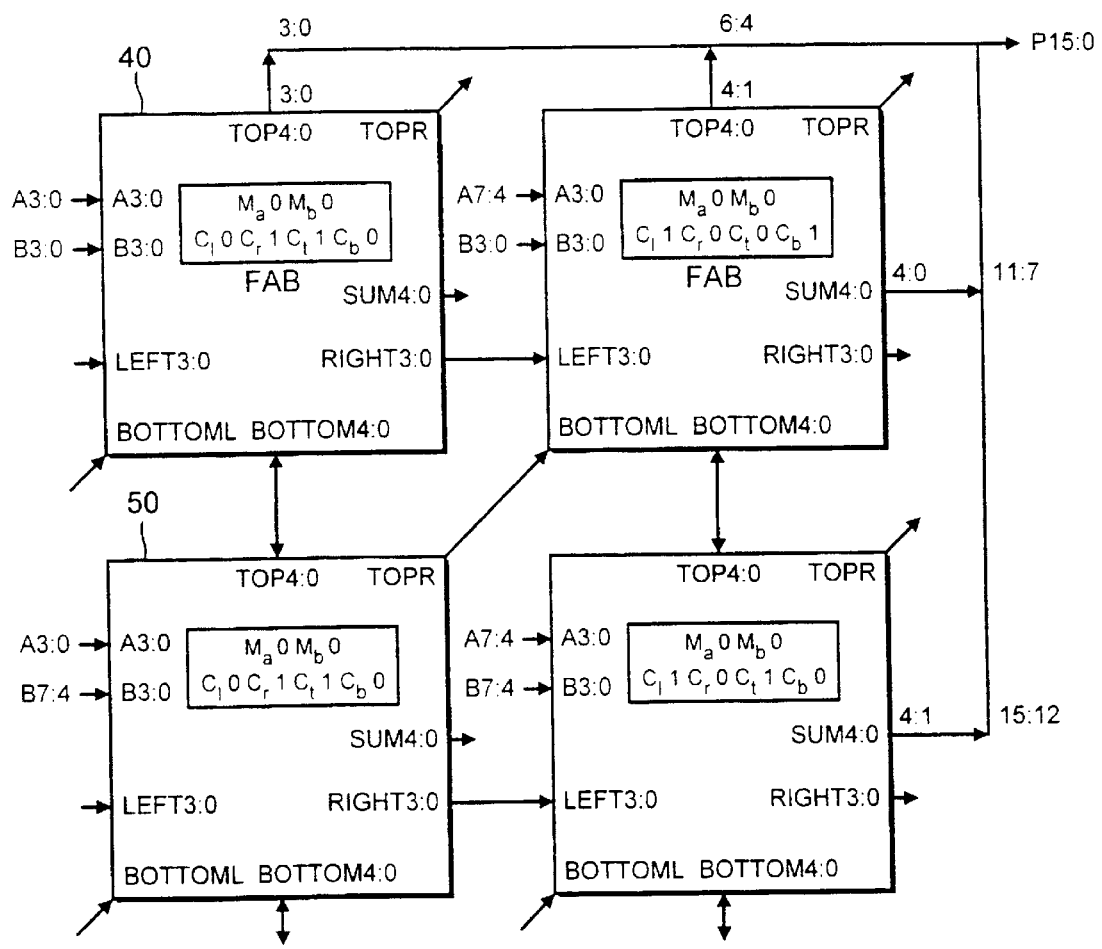
FIG. 5 schematically illustrates an unsigned 8×8 bit multiplier constructed using 4×4 FABs.

FIG. 5 shows how four 4×4 FABs, as described above, can be configured to produce an unsigned 8×8 bit multiplier. Here, the adders 30 in the two left hand FABs 40, 50 are redundant, and the remainder of the array is configured so as to produce a composite circuit similar to a single FAB but with an effective 8×8 array of functional units.

Figure 6:
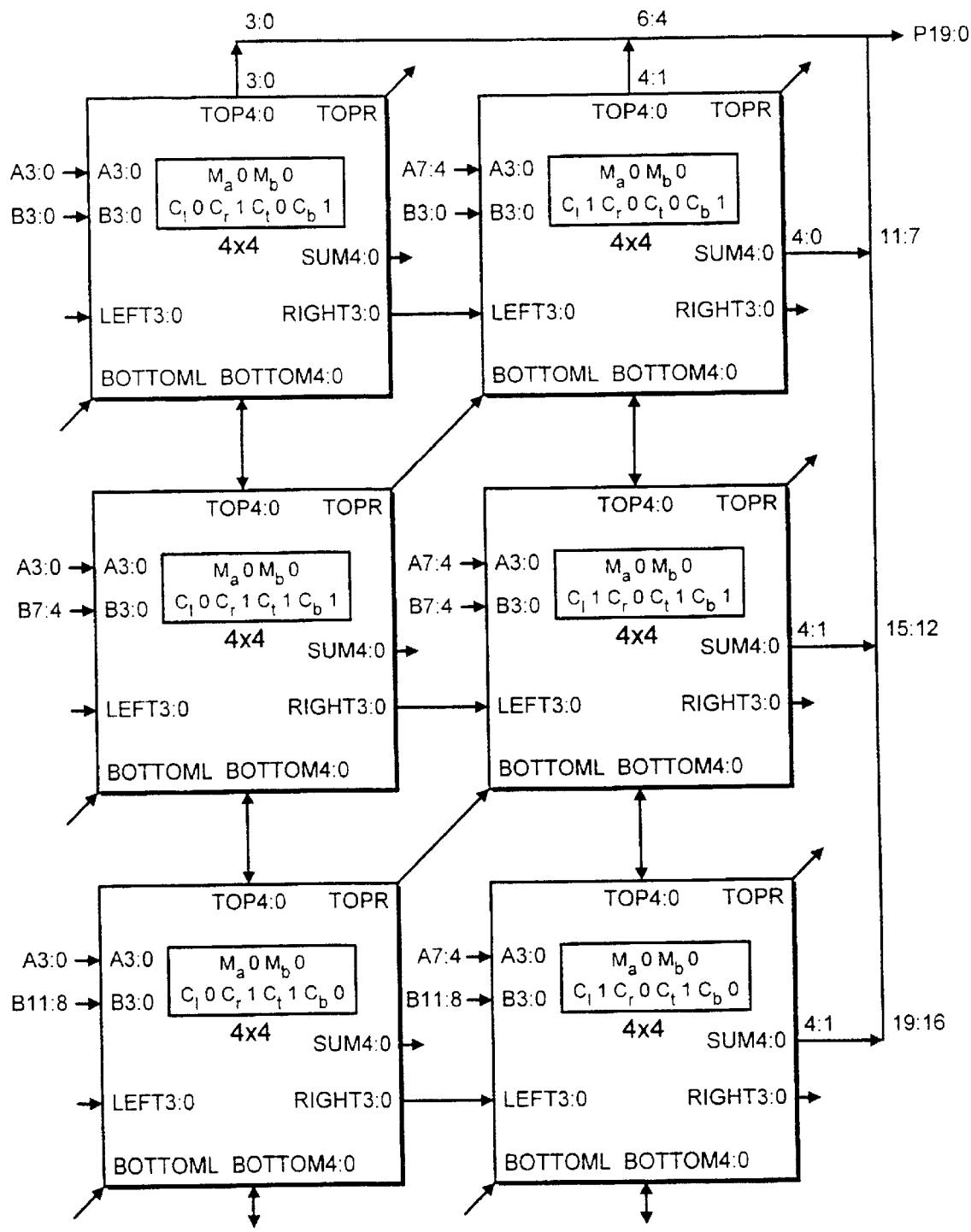
FIG. 6 schematically illustrates a two's complement 8×12 bit signed multiplier.

Similarly, FIG. 6 shows the configuration necessary for six 4×4 FABs to generate an 8×12 bit two's complement multiplier. The configuration bits $M_{a,b}$ for the FABs on the right hand column and on the bottom row of the array specify that the MSB multiplications are treated differently (as described above) in those FABs to accommodate the two's complement arithmetic.

The FAB has three modes of operation: i) both multiplicands are unsigned, ii) both multiplicands are signed, and iii) one multiplicand is unsigned, the other signed.

The proof for each case will be considered in this section.
A. Both Multiplicands are Unsigned A and B are unsigned n and m bit binary numbers, respectively, as given by (1) (both m and n must be multiples of 4)

$$A = \sum_{i=0}^{n-1} 2^i * a_i, \quad B = \sum_{j=0}^{m-1} 2^j * b_j \tag{1}$$

It can be easily shown that A*B is given by (2)

$$A * B = \sum_{i=0}^{n-1} \sum_{j=0}^{m-1} 2^{i+j} * a_i \cdot b_j \tag{2}$$

Figure 7:
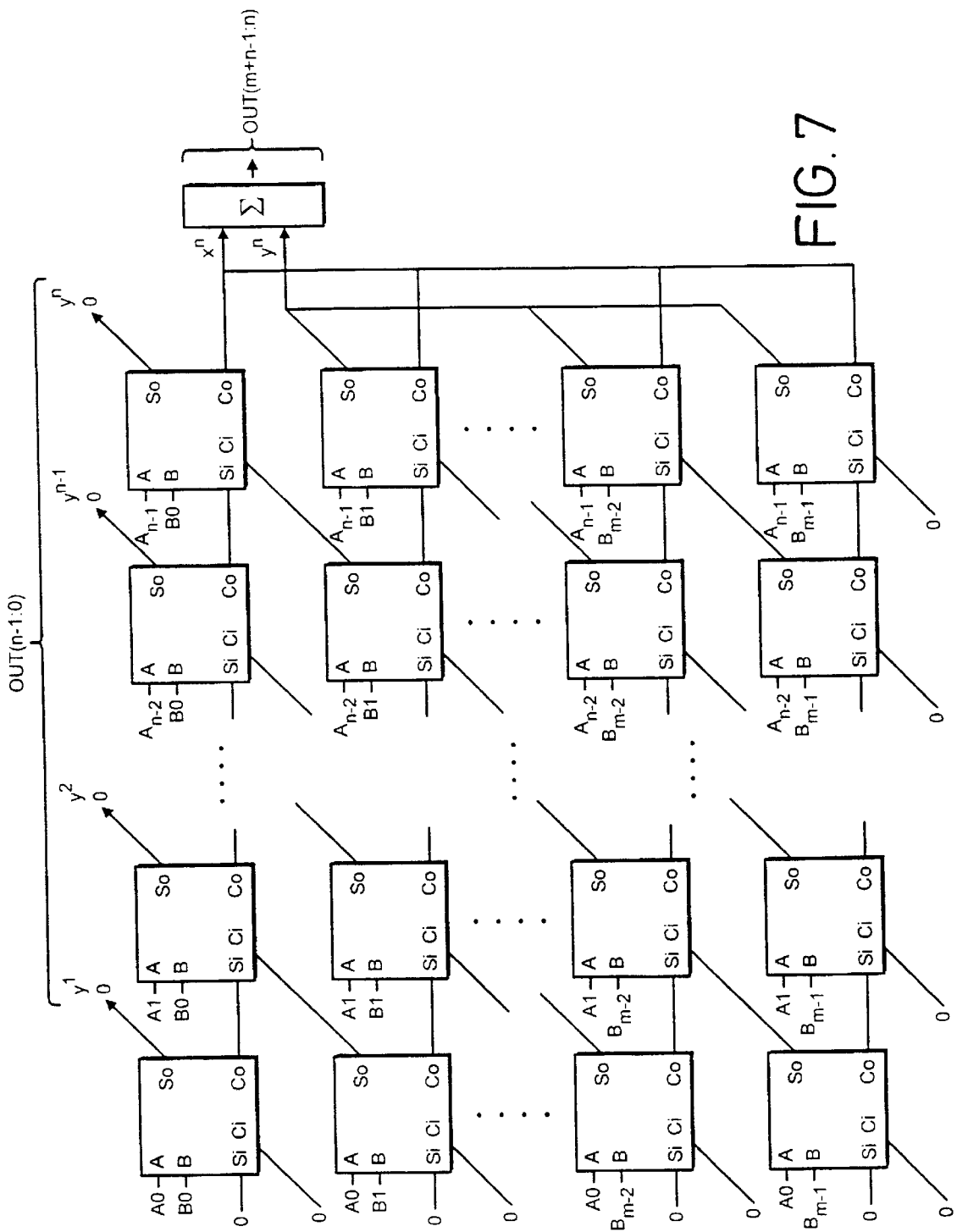
FIG. 7 schematically illustrates an equivalent circuit for an n×m bit unsigned multiplier.

When the array of FABs has been correctly configured for a n by m bit unsigned multiplication, an array of elements equivalent to that shown in FIG. 7 exists.

The output of this array is given by (3)

$$\text{Out} = 2^n(Y^n + X^n) + \sum_{i=0}^{n-1} 2^i * y_0^{i+1} \tag{3}$$

Figure 8:
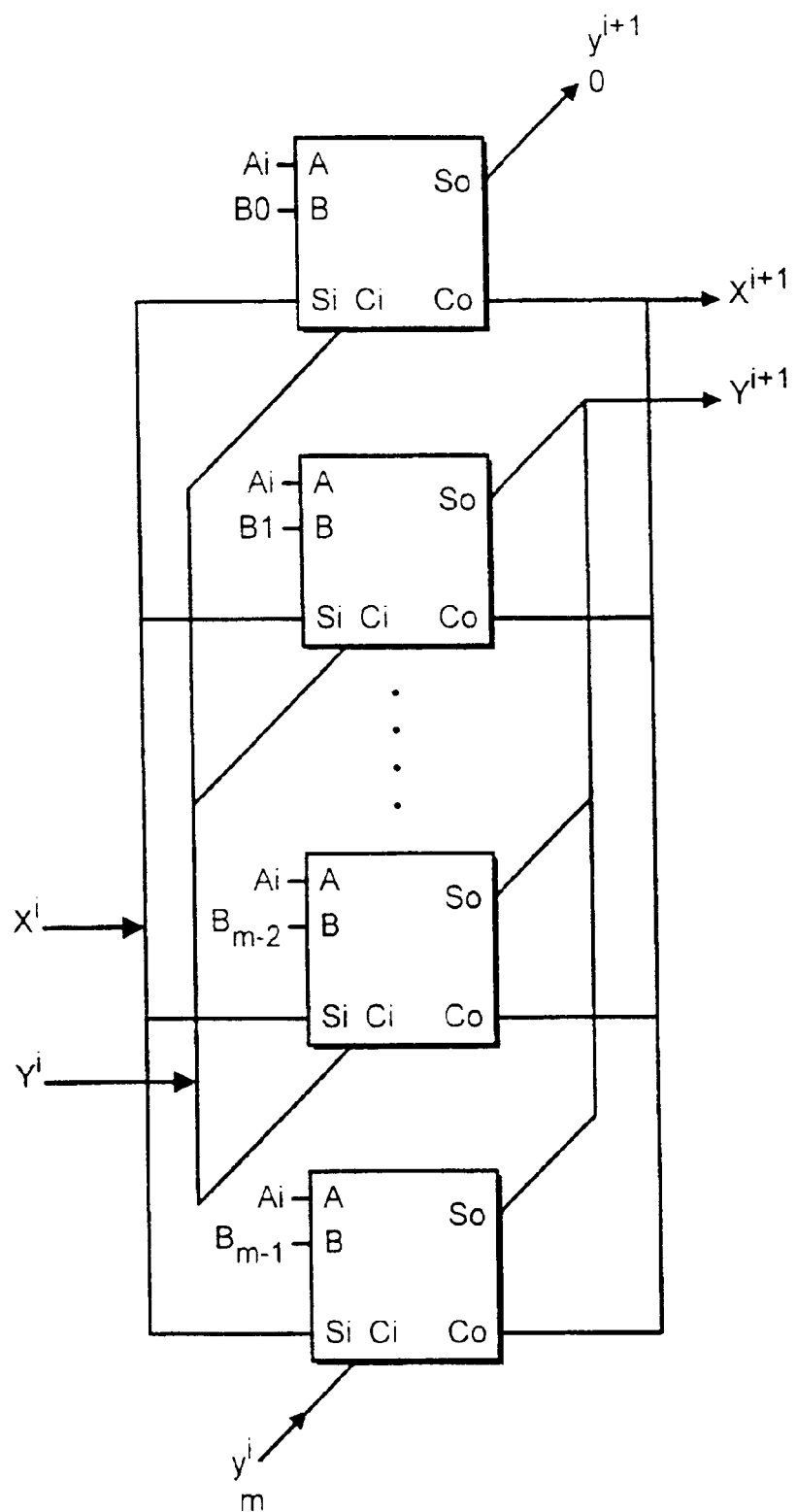
FIG. 8 schematically illustrates one column of the array of FIG. 7.

Consider one column of the multiplier array, as shown in FIG. 8. The output of the column is given by (4). By using the appropriate boundary conditions it is easily shown that the output of the multiplier array is given by (5), which is equivalent to the required result, as derived in (2).

$$2(Y^{i+1} + X^{i+1}) + y_0^{i+1} = X^i + Y^i + 2^{m-1}y_m^{i-1} + \sum_{j=0}^{m-1} 2^j * a_i \cdot b_j \tag{4}$$

BOUNDARY CONDITIONS:

$Y^0 = X^0 = y^i_m = 0$ $$2^n(Y^n + X^n) + \sum_{i=0}^{n-1} 2^i * y_0^{i+1} = \sum_{i=0}^{n-1} 2^i * \sum_{j=0}^{m-1} 2^j * a_i \cdot b_j \tag{5}$$

B. When Both Multiplicands are Two's Complement Signed Numbers

A and B are both two's complement signed n and m bit binary numbers, respectively, as given by (6).

$$A = \sum_{i=0}^{n-2} [2^i * a_i] - 2^{n-1} * a_{n-1}, \quad B = \sum_{j=0}^{m-2} [2^j * b_j] - 2^{m-1} * b_{m-1} \tag{6}$$

Therefore, it can be shown that A*B is given by (7).

$$A * B = \left(\sum_{i=0}^{n-2}\sum_{j=0}^{m-2} 2^{i+j} * a_i * b_j\right) - a_{n-1} * 2^{n-1} * \\ \left(\sum_{j=0}^{m-2} 2^j * b_j\right) - b_{m-1} * 2^{m-1} * \left(\sum_{i=0}^{n-2} 2^i * a_i\right) + a_n \tag{7}$$

Figure 9:
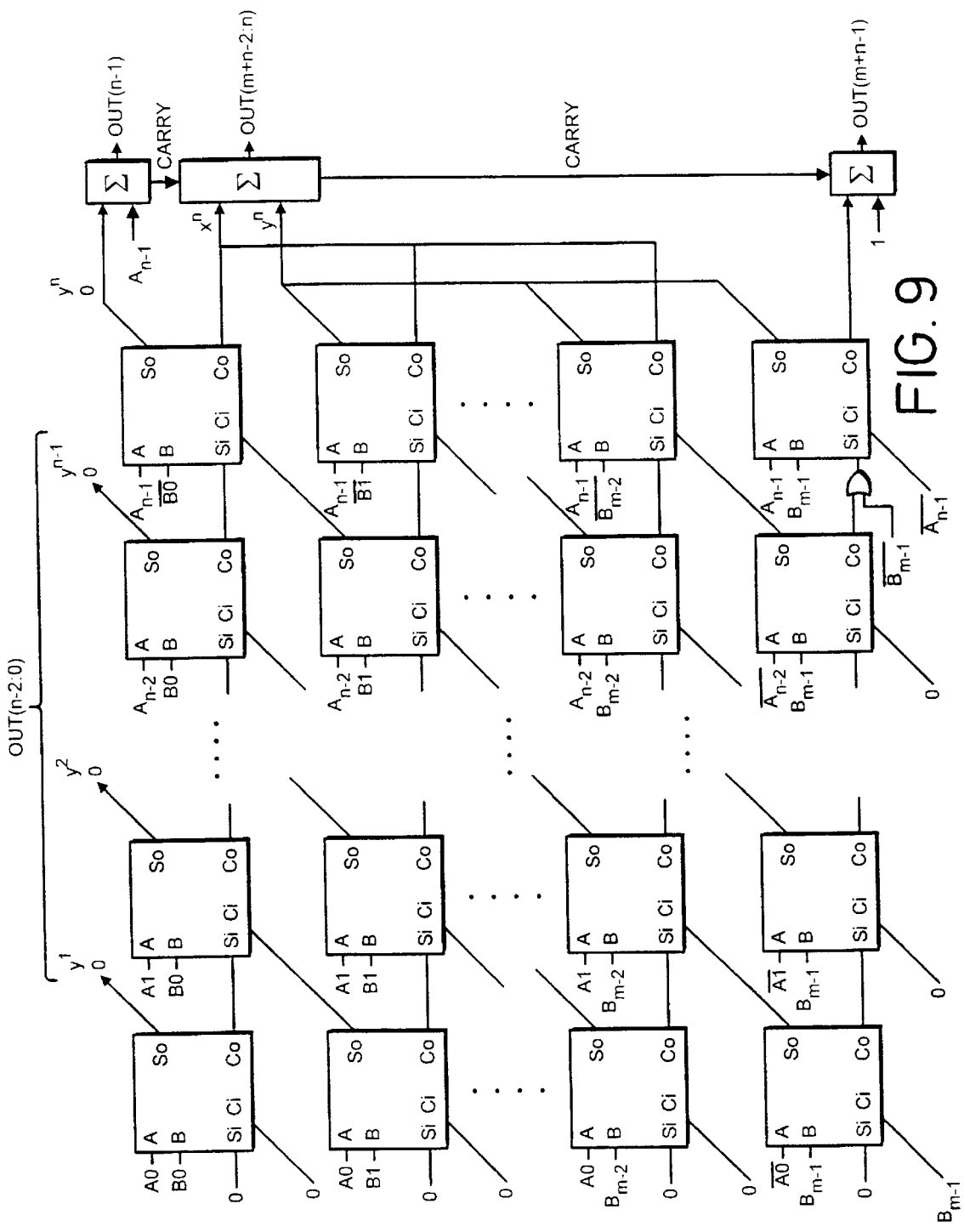
FIG. 9 schematically illustrates an equivalent circuit for an n×m bit signed multiplier.

When the array of FABs has been correctly configured for a n by m bit two's complement signed multiplication, an array of elements equivalent to that shown in FIG. 8 exists. The OR gate, present in FIG. 9, can be considered equivalent to an adder, because both inputs can never be high.

The output of this array can be seen to be given by (8).

$$\text{Out} = 2^n(Y^n + X^n) + \sum_{i=0}^{n-1} 2^i * y_0^{i+1} + 2^{m+n-1} + 2^{n-1}a_{n-1} \tag{8}$$

Figure 10:
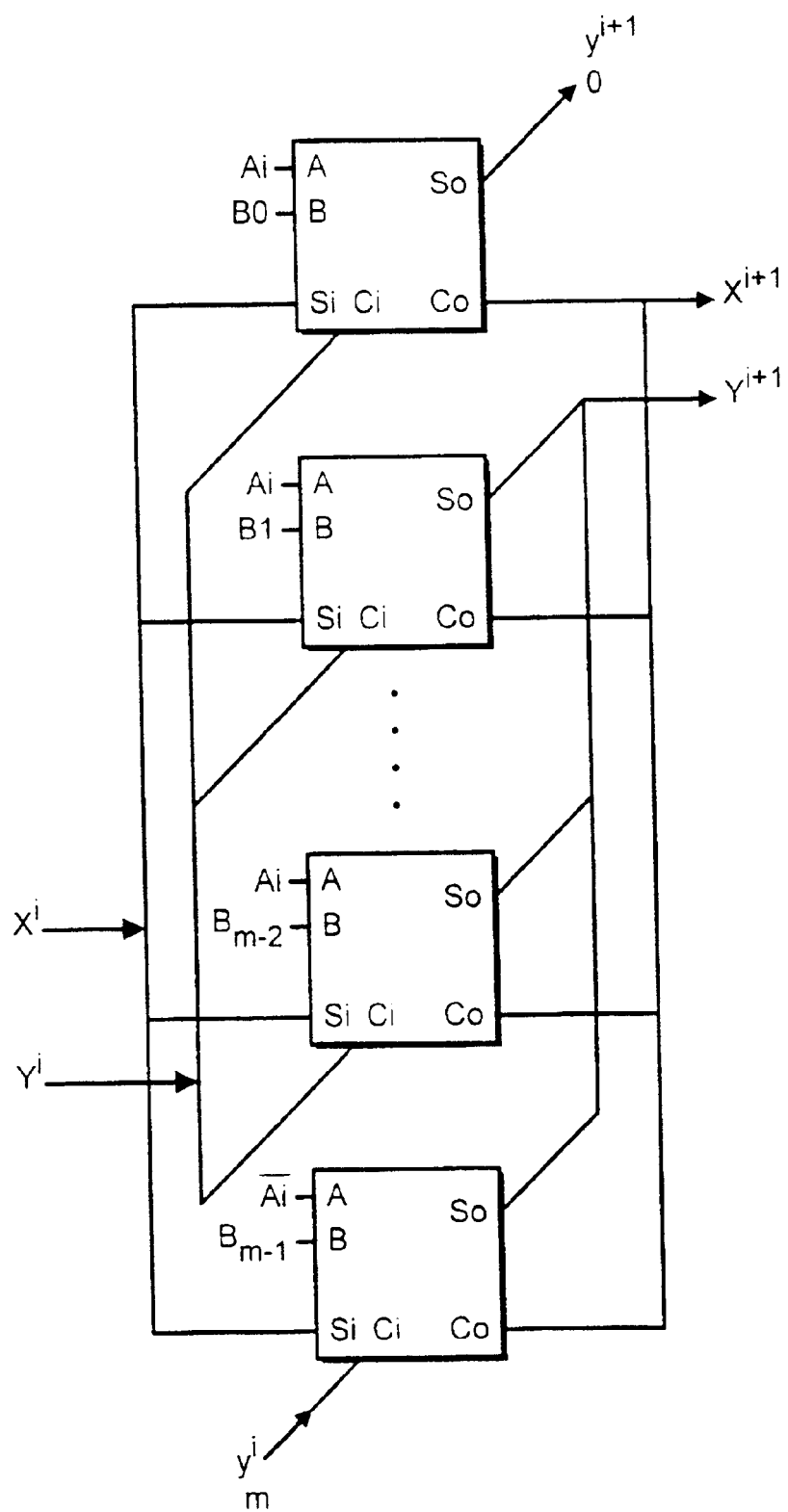
FIG. 10 schematically illustrates one column of the array of FIG. 9.

Consider the $i^{th}$ column of this array as shown in FIG. 10. The output of this column is given by (9).

$$2(Y^{i+1} + X^{i+1}) + y_0^{i+1} = X^i + Y^i + 2^{m-1}y_m^{i-1} + \tag{9}$$
$$\sum_{j=0}^{m-2} 2^j * a_i \cdot b_j + 2^{m-1} * \overline{a}_i \cdot b_{m-1},$$
$$(i \neq n-1)$$

$$2(Y^n + X^n) + y_0^n = X^{n-1} + Y^{n-1} \sum_{j=0}^{m-2} 2^j * a_i \cdot \overline{b}_j + 2^{m-1} *$$
$$(a_{n-1} \cdot b_{m-1} + \overline{b}_{m-1} + \overline{a}_{n-1}),$$
$$(i = n-1)$$

Using the appropriate boundary conditions, it is possible to calculate the output of the multiplier array as shown in (10).

BOUNDARY CONDITIONS:

$Y^0 = X^0 = 0, \; y^i_m = 0 \; (i \neq 0), \; y^0_m = b_{m-1}$ $$\sum_{i=0}^{n=2}\sum_{j=0}^{m-2} 2^{i=j} a_i \cdot b_j + 2^{n-1} \sum_{j=0}^{m-2} 2^j a_{n-1} \cdot \overline{b}_j + \quad (10)$$

$$2^{m-1} \sum_{i=0}^{n-2} 2^j \overline{a}_i \cdot b_{m-1} + 2^{m-1} b_{m-1} + 3*2^{m+n-1}(a_{n-1} \ OR \ b_{m-1})$$

This can be shown to be equivalent to (7).

C. One Multiplicand Unsigned, the Other A Two's Complement Signed Number

A is an n bit two's complement signed binary number, and B is unsigned m bit binary number as given in (11).

$$A = \sum_{i=0}^{n-2}[2^i * a_i] - 2^{n-1} * a_{N-1}, B = \sum_{j=0}^{m-1}[2^j * b_j] \quad (11)$$

Therefore, it can be shown that A*B is given by (12).

$$A*B = \left(\sum_{i=0}^{n-2}\sum_{j=0}^{m-2} 2^{i+j} * b_j * a_i\right) - a_{n-1} * 2^{n-1} * \left(\sum_{j=0}^{m-1} 2^j * b_j\right) \quad (12)$$

Figure 11:
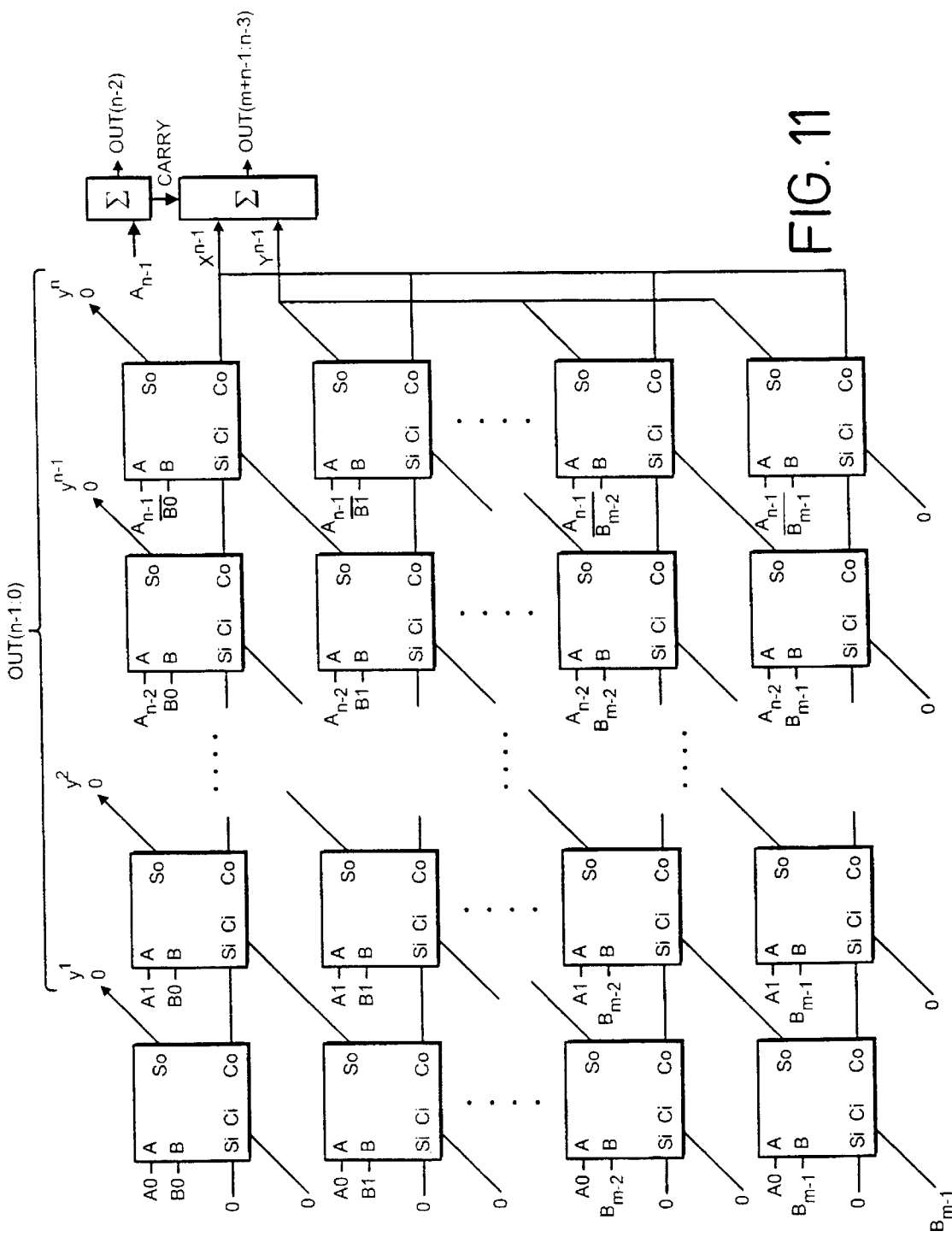
FIG. 11 schematically illustrates an equivalent circuit for an n×m bit multiplier, where one operand is signed and the other unsigned.

When the array of FABs has been correctly configured for a n by m bit multiplication, with A and B defined as in (11), an array of elements equivalent to that shown in FIG. 11 exists.

The output of this array can be seen to be given by (13).

$$Out = 2^n(Y^n + X^n) + \sum_{i=0}^{n-1} 2^i * y_0^{i+1} \quad (13)$$

Figure 12:
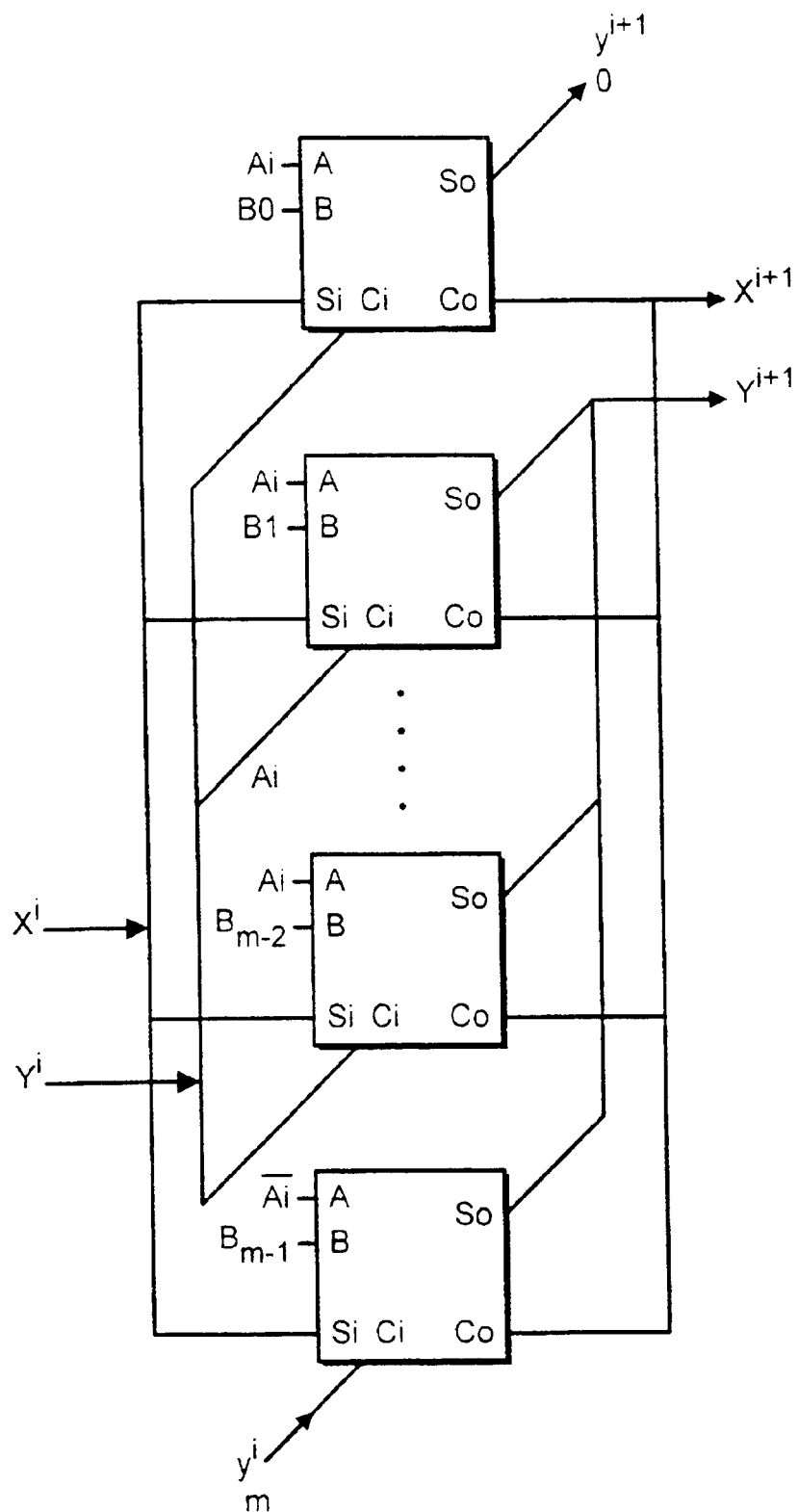
FIG. 12 schematically illustrates one column of the array of FIG. 11.

Consider the $i^{th}$ column of this array as shown in FIG. 12. The output of this column is given by (14).

$$2(Y^{i+1} + X^{i+1}) + y_0^{i+1} = X^i + Y^i + 2^{m-1} y_m^{i-1} + \quad (14)$$

$$\sum_{j=0}^{m-1} 2^j * a_i \cdot b_j, (i \ne n-1)$$

$$2(Y^n + X^n) + y_0^n = X^{n-1} + Y^{n-1} + 2^{m-1} y_m^{n-1} \sum_{j=0}^{m-2} 2^j * a_i \cdot \overline{b}_j,$$

$$(i = n-1)$$

Using the appropriate boundary conditions, it is possible to calculate the output of the multiplier array as shown in (15).

BOUNDARY CONDITIONS:

$Y^0 = X^0 = 0, Y^i_m = 0$ $$\sum_{i=0}^{n-2}\sum_{j=0}^{m-2} 2^{i+j} a_i \cdot b_j + 2^{n-1} \sum_{j=0}^{m-1} 2^j a_{n-1} \cdot \overline{b}_j + 3*2^{m+n-2} a_{n-1} \quad (15)$$

This can be shown to be equivalent to (12).

D. Summary of Proofs

It has been proven that the multiplier array will work correctly for unsigned, and signed two's complement numbers, when properly configured.

The FABs will now be compared to PAMs, as described by Hwang, in terms of speed and gate count. It is also compared to two fixed operand size schemes, the Baugh-Wooley Array, and the Wallace/Dadda to show that the cost of reconfigurability is small.

The FAB scheme is also compared to multipliers implemented using FPGAs, to show that there is a significant reduction in the die area required.

A. Speed of the FAB Scheme

Table II shows that the delay of the FABs is much better than the Hwang reconfigurable array, and is comparable to that of the Baugh-Wooley fixed size operand array. The delay of the PAMs is of $O(N^2)$, whilst the delay of the FABs is of $O(N)$. The delay of the Wallace/Dadda multiplier is of $O(\log_2 N)$

TABLE II

GATE DELAY FOR VARIOUS MULTIPLIER SCHEMES

| Scheme | Configurable | 8 Bits | 16 Bits | 32 Bits | 64 Bits |
|---|---|---|---|---|---|
| Hwang's PAMS | yes | 48 | 160 | 576 | 2176 |
| FABs | yes | 34 | 66 | 130 | 258 |
| Baugh-Wooley | no | 30 | 62 | 126 | 254 |
| Wallace/Dadda | no | 32 | 52 | 80 | 124 |

(Assuming that Full Adders are used to implement the final addition stage in all cases)

B. Gate Count for the FAB Scheme

Table III shows that, in terms of the number of gates required, the FABs are slightly most costly (≈3%) than the existing Hwang reconfigurable scheme. The FAB scheme is more costly than either of the two fixed size operands schemes, with 50% more gates being required.

TABLE III

COMPARISON OF THE NUMBER OF GATES REQUIRED FOR VARIOUS MULTIPLIER SCHEMES

| Scheme | Configurable | 8 Bits | 16 Bits | 32 Bits | 64 Bits |
|---|---|---|---|---|---|
| Hwang's PAMS | yes | 644 | 2576 | 10304 | 41216 |
| FABs | yes | 664 | 2656 | 10624 | 42496 |
| Baugh-Wooley | no | 413 | 1701 | 6965 | 28245 |
| Wallace/Dadda | no | 379 | 1763 | 7603 | 31571 |

(Assuming that Full Adders are used to implement the final addition stage in all cases)

C. Number of Interconnects Required Between FABs

The price which must be paid for the significant increase in speed when using FABs, compared to the PAMs is the 50% increase in the number of interconnects between the FABs, when compared with the PAMs, as shown in table IV.

TABLE IV

COMPARISON OF THE NUMBER OF INTERCONNECTS BETWEEN EACH BLOCK

| Scheme | Number of interconnects for a 4 × 4 reconfigurable block |
|---|---|
| Hwang's PAMs | 26 |
| FABs | 39 |
| Baugh-Wooley | N/A |
| Wallace/Dadda | N/A |

(N.B. figures exclude the configuration control, and power)

D. Comparison with Conventional FPGAs

The FAB scheme is compared to multipliers implemented using Altera's FLEX10K, and Xilinx's 4000 series FPGAs, in terms of die area required.

The number of transistors required has been chosen as the best metric for comparing the relative die area for each scheme. This is a valid assumption because most modern processes have a large number of metal layers, making routing less of a bottle neck. The number of transistors includes any required for the configuration, and routing of any cells used.

For all the considered schemes the amount of hardware required to implement an n×n bit multiplier proportional to $n^2$, for n>4 and n a multiple of 4.

A Xilinx 4000 FPGA requires, on average, $1.14*n^2$ CLBs (Configurable Logic Blocks) to implement an n×n bit multiplier (73 CLBs are needed for an 8×8 multiplier [9]). For the Xilinx 4000 part each Cell (CLBs in this instance) requires 4 700 transistors. This figure includes all transistors required for configuration, routing, and CLB logic.

From extensive experimentation, we have found that the Altera Flex 10K part requires, on average, $0.41*n^2$ LABs (Logic Array Blocks) to implement a n×n multiplier. We have estimated that each LAB requires about 13 700 transistors, for configuration, routing, and cell logic.

Using the FAB scheme, each 4×4 Cell requires approximately 2 600 transistors, with 0.0625 FABs being required per $bit^2$.

Table V shows that the FAB scheme requires about 35 times less die area than either the Flex10k, or 4000 FPGA.

TABLE V

COMPARISON OF THE DIE AREA REQUIRE
FOR IMPLEMENTING MULTIPLIERS USING
FPGAs AND THE FAB SCHEME

| Implementation | Trans. per Cell | Cells per $Bit^2$ | Trans. per $Bit^2$ | Relative Area |
|---|---|---|---|---|
| FABs | 2600 | 0.0625 | 160 | 1 |
| Altera Flex 10K | 13700 | 0.26 | 3562 | 22 |
| Xilinx 4000 | 4000 | 1.14 | 4560 | 28 |

Figure 13:
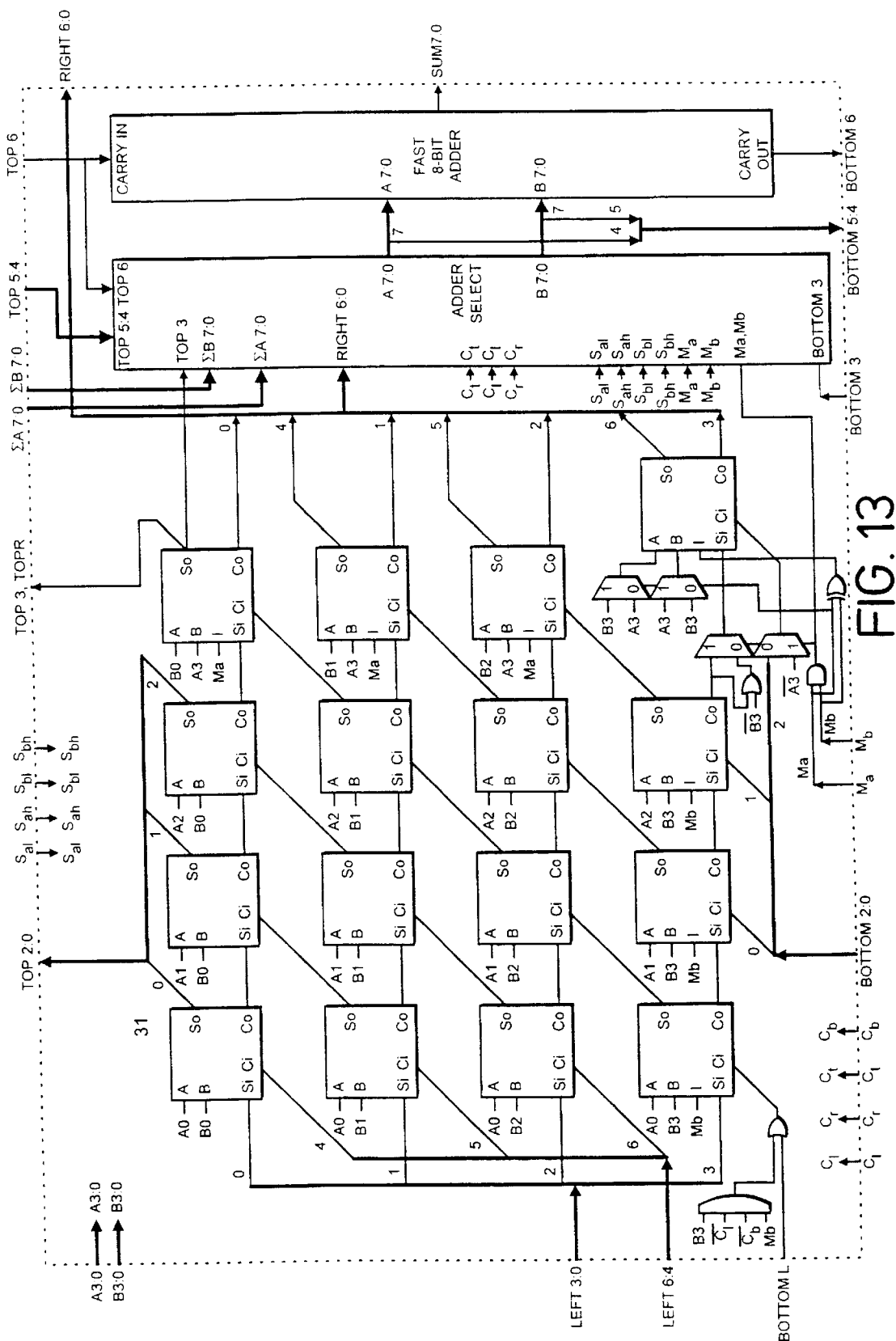
FIG. 13 schematically illustrates a further embodiment of a FAB.
Figure 14:
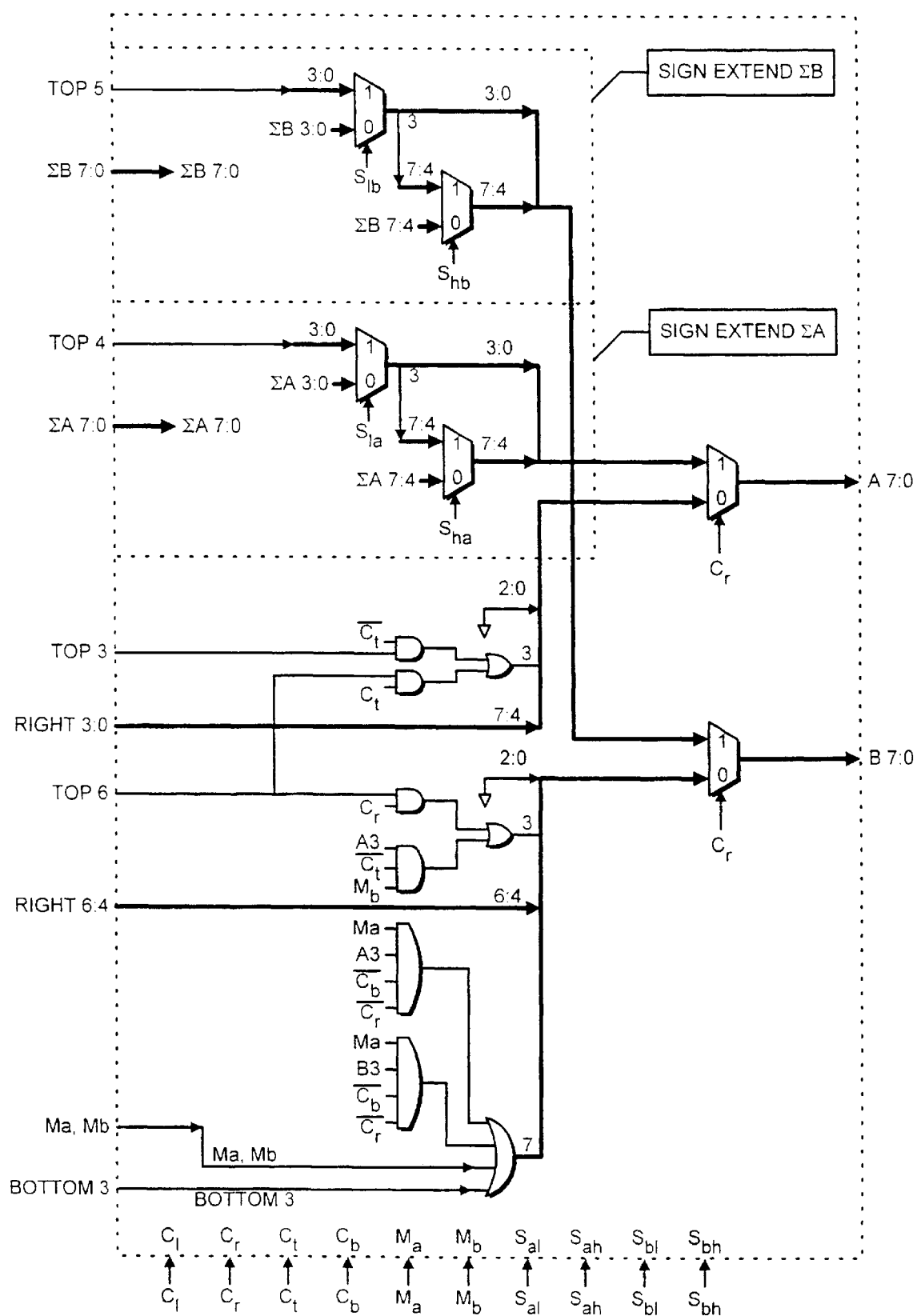
FIG. 14 schematically illustrates an adder select block.
Figure 15:
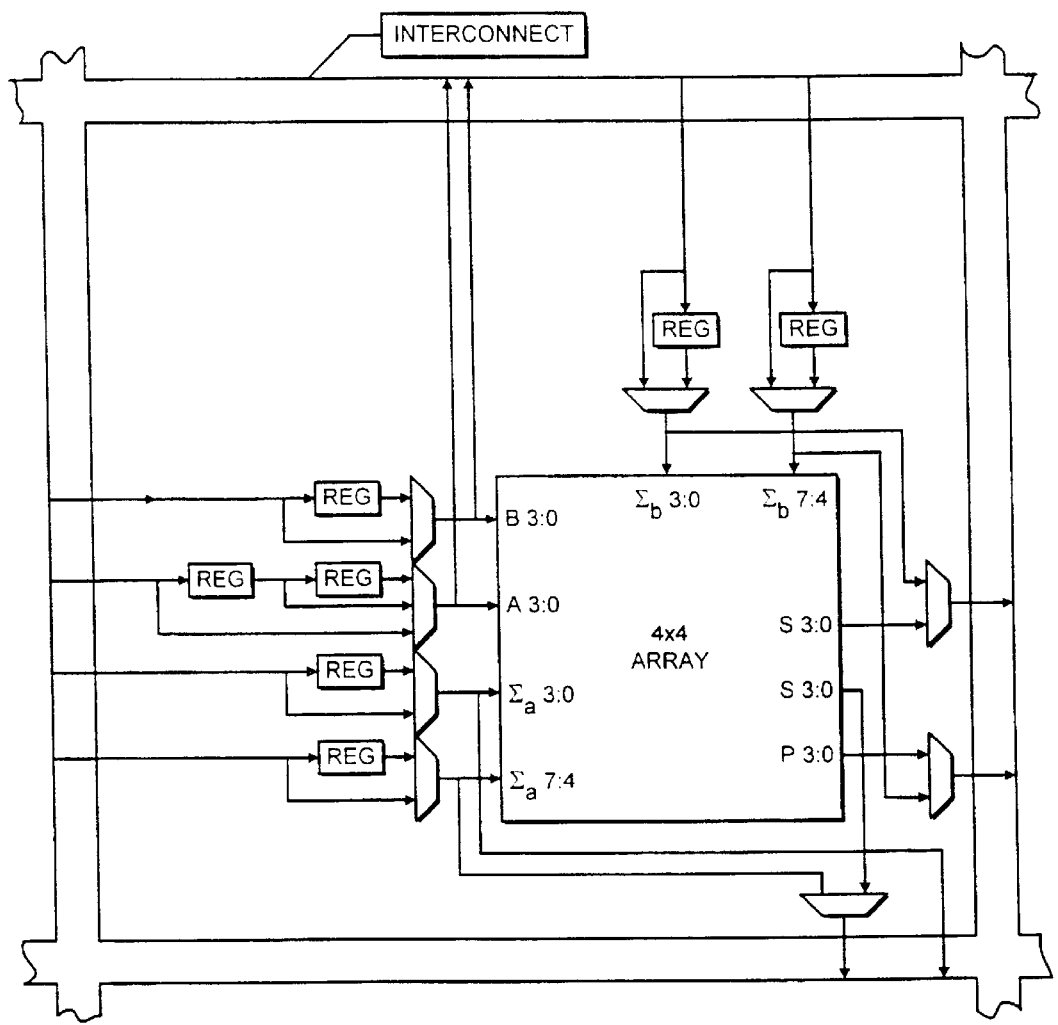
FIG. 15 schematically illustrates a further embodiment.

The 5-bit adder in each FAB is only used if the FAB is on the far right hand side of the multiplier. Therefore, if the size of either multiplicand is greater than 4 bits, there are a number of "spare" adders available. With minimal cost in terms of extra hardware and multiplier performance, it would be possible to extend these adders to 8-bit adders, as shown by FIG. 13, and FIG. 14.

This would require 4 more configuration bits to sign extend the inputs to the adders, and 2 additional vertical connections between each FAB.

Figure 16:
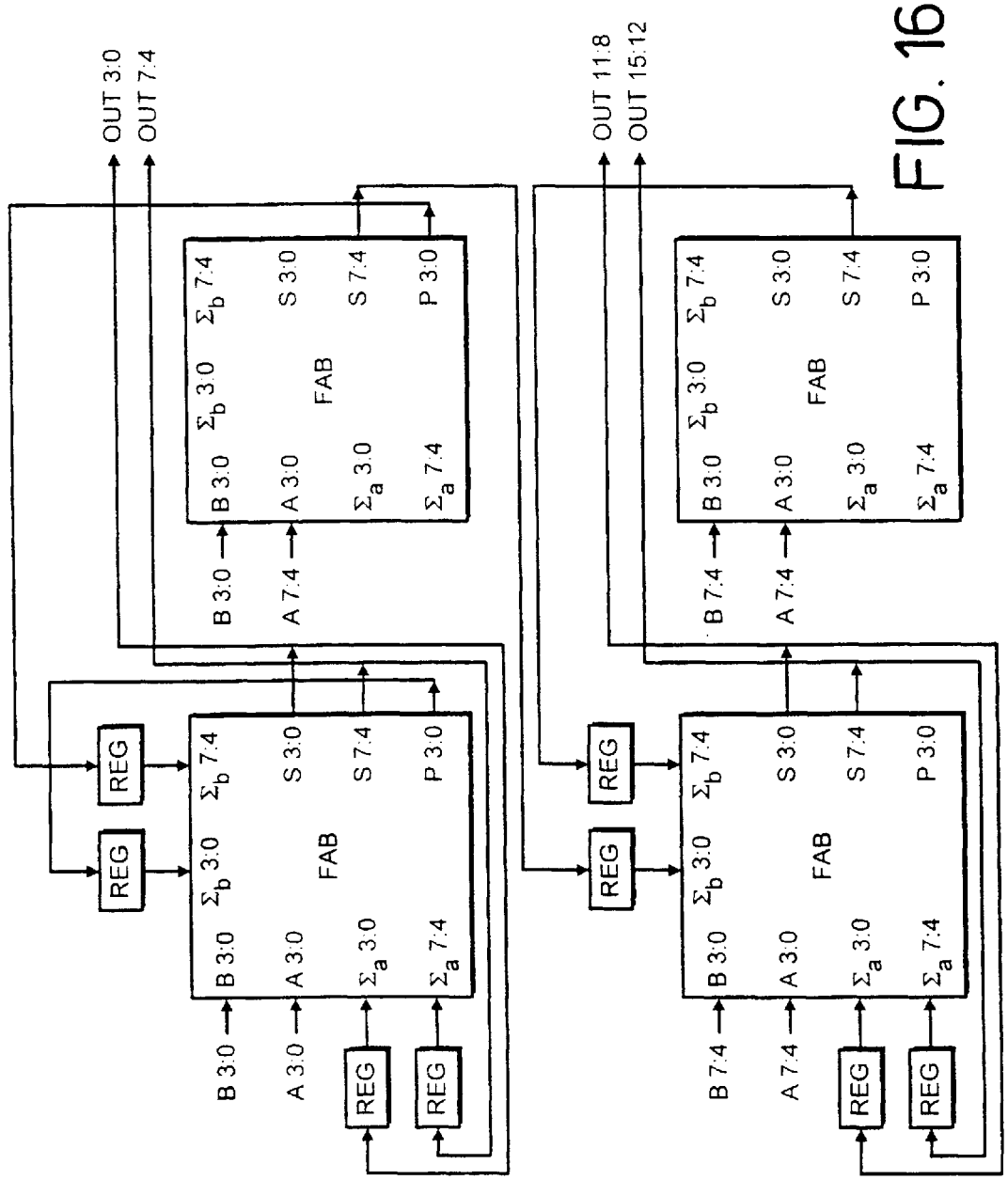
FIG. 16 schematically illustrates further possible modifications.

This small alteration would enable simple implementation of structures such as multiply-accumulators (MACs) and finite impulse response filters (FIRs) to be embedded within the multiplier array. FIG. 16 shows how an 8×8 MAC can be implemented using 4 FABs. The FABs should be connected as before.

This section discusses the possible ways in which an array of FABs could be used. The key point is that the array of FABs can be of any size, the bigger the array the larger the number of multiplications that can be carried out, or the larger the size of the multiplicands can be. There are three basic methods which the array could be used, as a stand alone reconfigurable chip, for use within a system, incorporated in an FPGA type architecture as a block, or as an array interspersed within an FPGA architecture.

Figure 17:
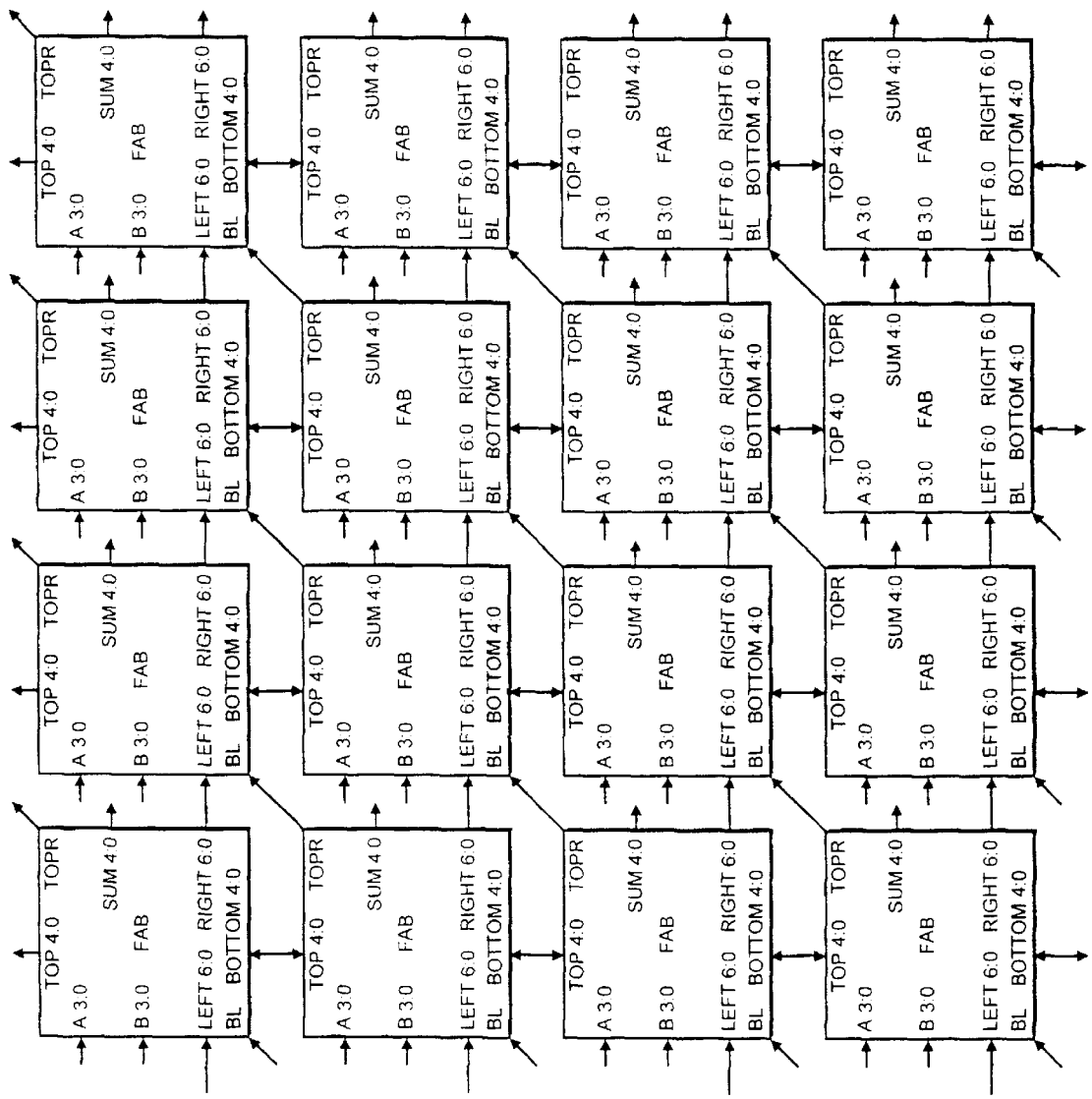
FIG. 17 schematically illustrates a connection architecture for FABs.

The basic connection architecture is shown in FIG. 17. This is basically an extension of the schematic connection architecture of FIG. 3.

A. As a Stand Alone Reconfigurable Chip

Figure 18:
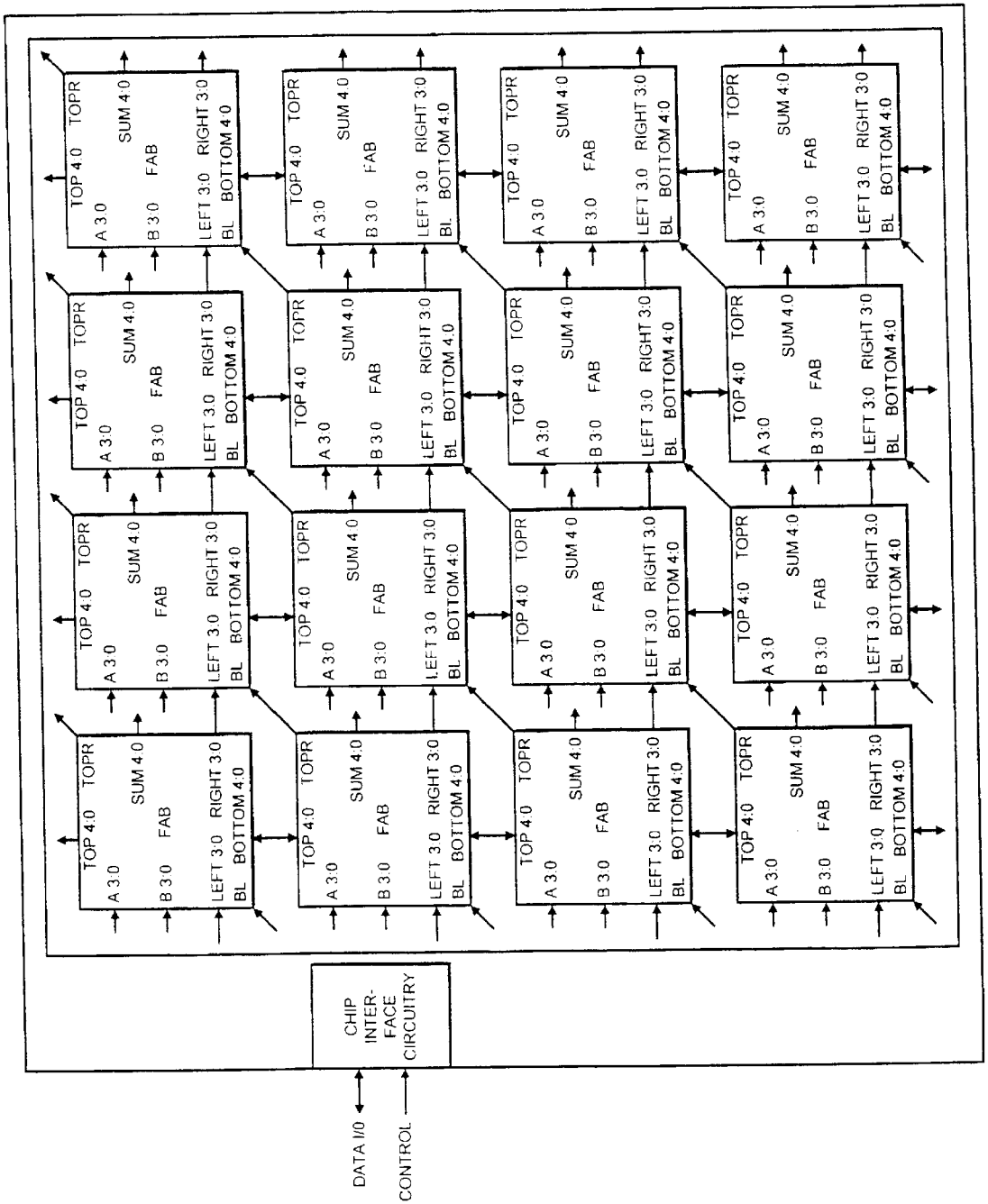
FIG. 18 schematically illustrates an array of FABs configured as a stand-alone integrated circuit.

Using the array as a stand alone reconfigurable chip an array of FABs could be implemented using a custom ASIC, with appropriate I/O and control circuitry, as shown in FIG. 18.

B. Incorporated into an FPGA Architecture as a Block

Figure 19:
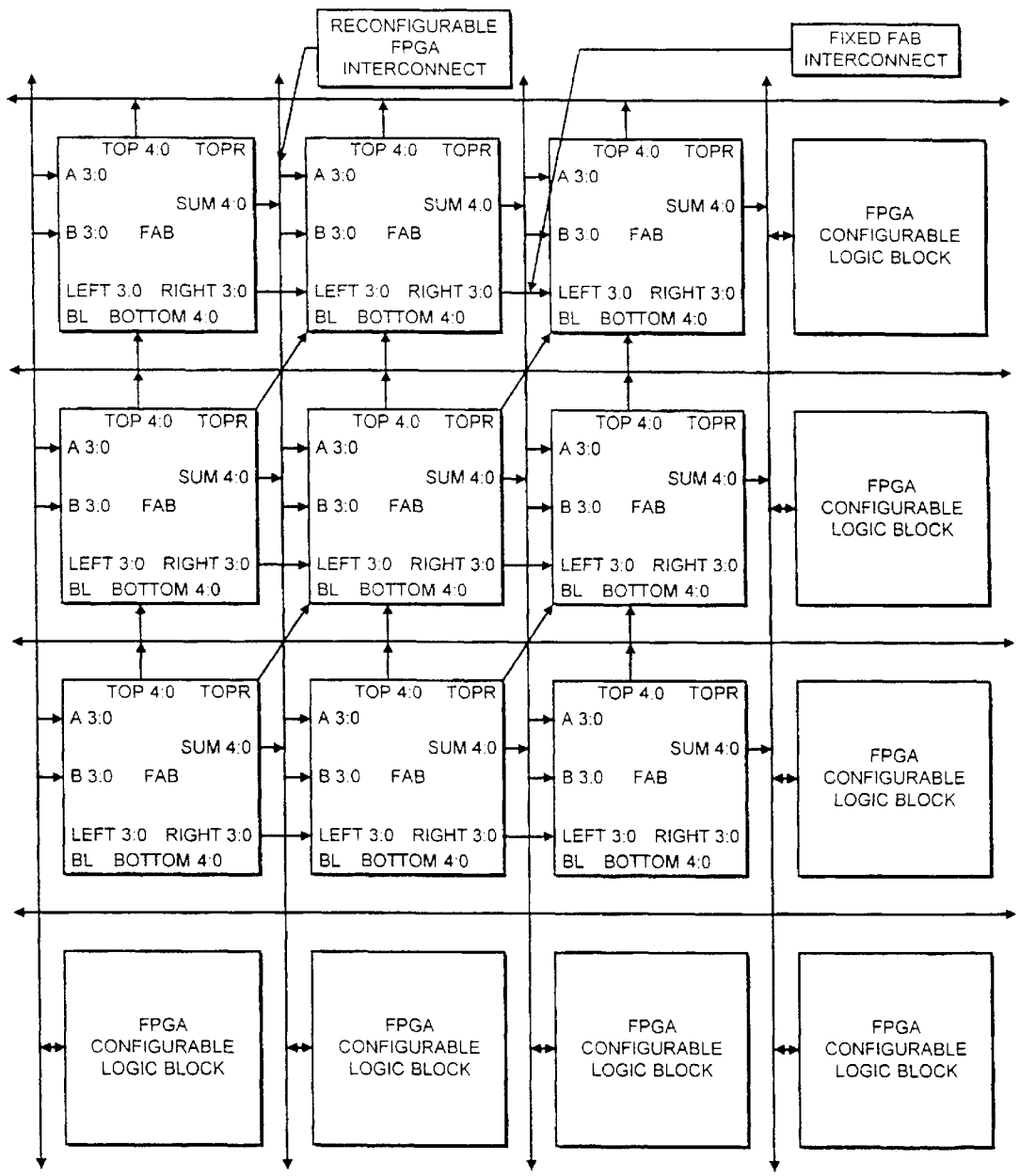
FIG. 19 schematically illustrates an array of FABs incorporated into an FPGA.

When the FAB is incorporated into an FPGA as a "block", one or more particular areas of the FPGA are devoted to the array of FABs, as shown in FIG. 19. The array of FABs could contain any number of FAB units. More than one "block" of FABs could be used in an FPGA, and they could operate either independently (there are no fixed interconnects between the blocks), or as one large array of FABs (there is fixed interconnect between each block of FABs).

C. Interspersed into an FPGA Architecture as a Block

Figure 20:
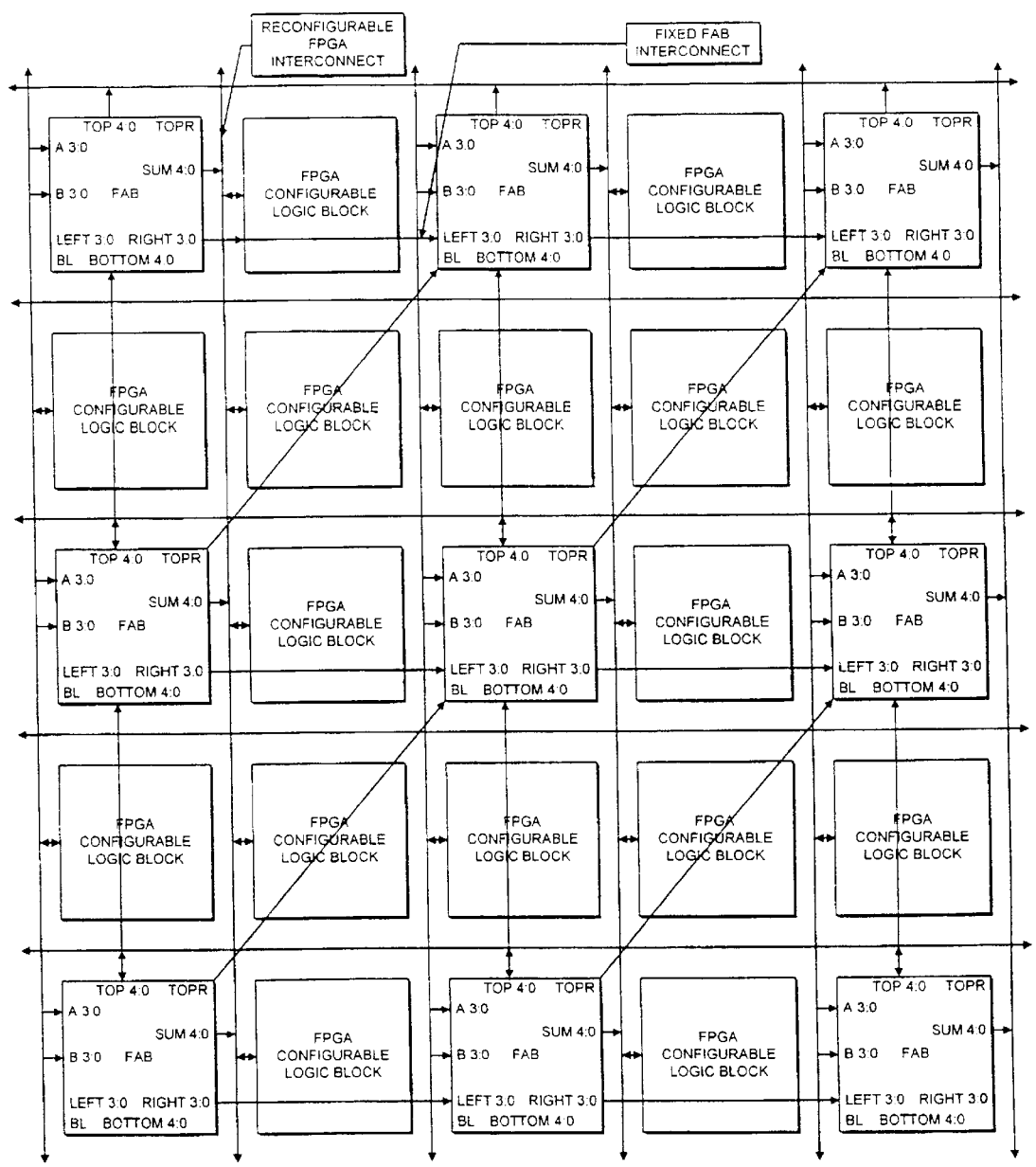
FIG. 20 schematically illustrates an array of FABs interspersed into an FPGA.

Another method of using the FAB array would be to intersperse the array throughout an FPGA-type structure. This could allow the data to be generated and used locally, saving on reconfigurable interconnection. This is shown in FIG. 20.

Again, there could be any number of FAB units in such a scheme, and any number of FPGA configurable logic blocks could be placed in-between the FAB units.

In summary, embodiments of the invention provide a design for a reconfigurable flexible multiplier which can be considerably faster than existing reconfigurable multipliers reported previously in the literature. The speed improvements are gained at the cost of adding extra interconnects between the reconfigurable blocks. It is estimated that this design is approximately 35 more efficient in terms of silicon area/speed than using an FPGA. Such a design should enable substantial savings of resources in the FPGA when used for image/video processing applications.

Figure 21:
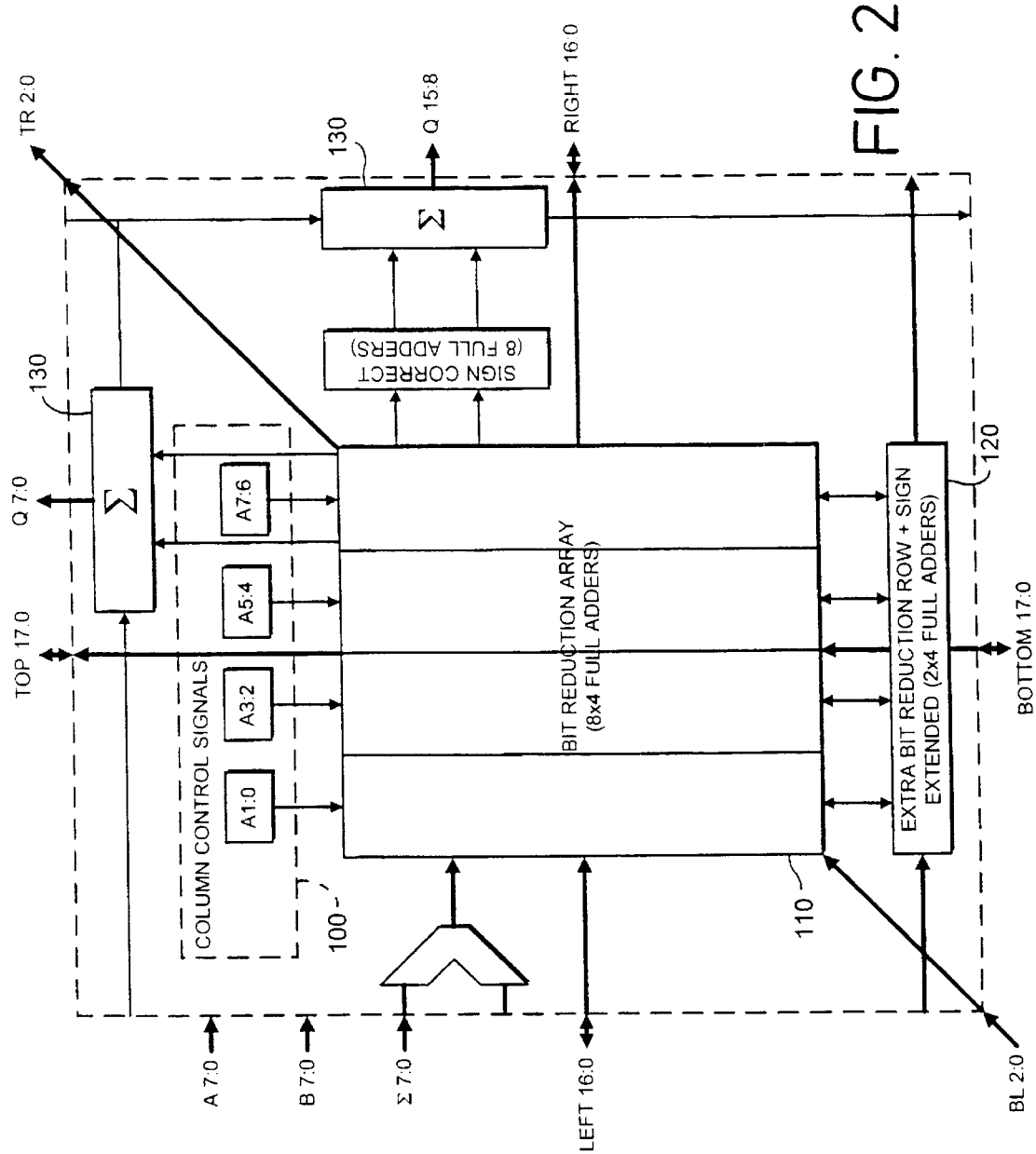
FIG. 21 schematically illustrates an 8×8 modified flexible array block (MFAB)

An alternative embodiment of the invention is shown in FIG. 21 and will be referred to as a modified flexible 8×8 multiplier block (MFAB).

The MFAB block is based on the radix-4 overlapped multiple-bit scanning algorithm as described in [10]. The blocks consist of four key parts:

(i) A multiplier decoder block 100, at the top of each column which each take two bits of the multiplicand and generate the necessary control signals for the column (i.e. whether to add −2,−1,0,1, or 2 times the multiplicand).

(ii) A main array 110 of 8 by 4 units which performs the bit reduction, and is used to form part of the larger bit reduction array required when the blocks are cascaded.

(iii) Extra units 120 which are required if the block is on the edge of a larger array (i.e. it uses the MSB of the multiplier or multiplicand); these are necessary for the blocks to be able to cope with both signed and unsigned multiplication.

(iv) Adders 130 which produce the final output. The top adder is used when the block uses the LSB of the multiplicand, and the adder to the right of the array is used when the block utilises the MSB of the multiplicand.

Figure 22:
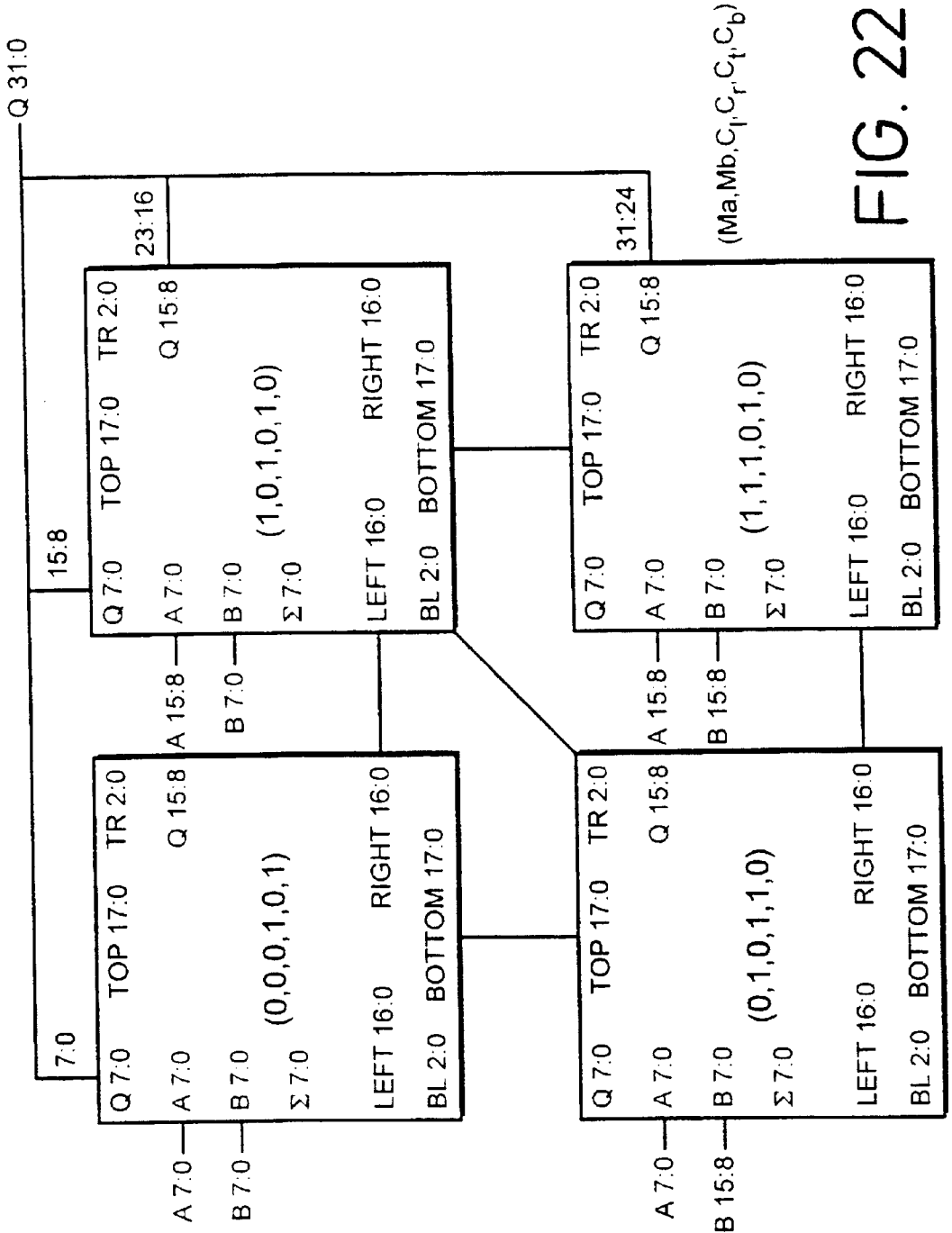
FIG. 22 schematically illustrates a 16×16 two's complement signed multiplier using four 8×8 MFAB blocks.

Each block is configured using the six configuration bits Ma, Mb, Cl, Cr, Ct, and Cb as shown in Table VI. FIG. 22 shows schematically how 4 MFAB blocks can be used to construct a 16×16 two's complement signed multiplier.

TABLE VI

CONFIGURATION SETTINGS FOR THE MFAB

| Bit | Meaning |
|---|---|
| Ma | High if A7 is the MSB of a signed number |
| Mb | High if B7 is the MSB of a signed number |
| Cl | High if A0 is not the LSB of the multiplicand A |
| Cr | High if A7 is not the MSB of the multiplicand A |

TABLE VI-continued

CONFIGURATION SETTINGS FOR THE MFAB

| Bit | Meaning |
|---|---|
| Cb | High if B7 is not the MSB of the multiplier B |
| Ct | High if B0 is not the LSB of the multiplier B |

Comparison with existing designs

The modified flexible array block (MFAB), is compared to 8×8 PAMs, as described in [5], in terms of speed, and estimated transistor count. It is also compared the FAB scheme. In order to give a fair comparison 8×8 FABs, and 8×8 PAMs have been used. In the case of both the FABs & MFABs carry-select adder schemes have been used to implement the final column adders, to yield improved multiplication times.

Table VII shows that, in terms of the numbers of transistors required, the MFAB is more costly ($\approx 30\%$) than the PAM reconfigurable scheme, this is largely due to the expensive carry-select adder scheme used in the final column. However, it is less costly then the FAB scheme ($\approx -7\%$).

TABLE VII

APPROXIMATE NUMBER OF TRANSISTORS REQUIRED FOR VARIOUS MULTIPLIER SCHEMES

| Multiplier size | 8 × 8 | 16 × 16 | 32 × 32 | 64 × 64 |
|---|---|---|---|---|
| Hwang's PAMs | 1840 | 7360 | 29440 | 117760 |
| FAB (8 × 8) | 2558 | 10232 | 40928 | 163712 |
| MFAB (8 × 8) | 2380 | 9520 | 38080 | 152320 |

Table VIII shows the total delay, in terms of full adders, for the PAM, MFAB, and FAB schemes when 8×8 blocks are used to construct multipliers of varying sizes. The speed of the MFAB is much better than the PAM reconfigurable array (286% faster, for a 32×32 multiplier), and enjoys a considerable improvement over the FAB scheme (52% faster).

TABLE VIII

APPROXIMATE FULL ADDER DELAYS OF VARIOUS MULTIPLIER SCHEMES

| Multiplier size | 8 × 8 | 16 × 16 | 32 × 32 | 64 × 64 |
|---|---|---|---|---|
| Hwang's PAMs (8 × 8) | 16 | 48 | 112 | 240 |
| FAB (8 × 8) | 14 | 24 | 44 | 84 |
| MFAB (8 × 8) | 11 | 17 | 17 | 53 |

Another very important figure of merit for the blocks is the number of reconfigurable connections required by each scheme, shown in Table IX.

TABLE IX

COMPARISON OF THE NUMBER OF RECONFIGURABLE CONNECTIONS REQUIRED BY EACH SCHEME

| Scheme | Number of reconfigurable connections required for an 8 × 8 reconfigurable block |
|---|---|
| Hwang's PAMs | 48 |
| FAB (8 × 9) | 32 |
| MFAB (8 × 8) | 40 |

It has been reported that the reconfigurable interconnection structure a typical FPGA takes up $\approx 90\%$ of the silicon die area of the device [8]. Indeed, this is the main reason why the MFAB provides significant saving in silicon area over the conventional FPGA implementation. It is therefore important that the number of reconfigurable interconnections be reduced, preferably to a minimum. For both the MFAB and FAB schemes the majority of the interconnect for each block connects to the adjacent blocks in a regular and scalable way, which means that dedicated interconnect can be utilised. This leaves only the actual data inputs and outputs to be routed to the reconfigurable interconnect (32 in the case of the FAB and 40 in the case of the MFAB, since it has an additional summing input). The PAM scheme requires 48 reconfigurable interconnects for an 8×8 block.

The MFABs also have provision for an extra summing input (labelled as $\Sigma 7:0$ in FIG. 21), which is not available without additional circuitry using the FABs. This enables simple implementation of multiply-accumulate operations (MACs), and FIR filters.

Comparison with Conventional FPGA Structures

Here the MFAB scheme is compared to multipliers implemented using Altera's FLEX10K, and Xilinx's 4000 series FPGAs, in terms of total silicon die area required.

An estimate of transistor count has been chosen as the best metric for comparing the relative die area for each scheme. We believe this to be a reasonable assumption because most modem processes have a large number of metal layers, making fixed routing less of a bottle neck. In order to give a fair comparison, the number of transistors given in this section includes any required for the configuration SRAM, and reconfigurable routing required by the cells.

For both conventional FPGA architectures and the MFAB scheme the amount of hardware required to implement an n x n bit multiplier is approximately proportional to $n^2$, for n>8 and n a multiple of 8.

Using the MFAB scheme, each 8×8 Cell requires approximately 7000 Transistors (2600 for the basic MFAB+4400 for the reconfigurable routing), with 0.01563 MFABs being required per bit 2. Table X shows that the MFAB scheme requires about 30 times less die area than either the FLEX10k, or Xilinx 4000 FPGA.

TABLE X

COMPARISON OF THE DIE AREA REQUIRED FOR IMPLEMENTING MULTIPLIERS USING CONVENTIONAL FPGAs AND THE MFAB SCHEME

| Implementation | Trans. per Cell | Cells per Bit$^2$ | Trans. per Bit$^2$ | Relative Area |
|---|---|---|---|---|
| MFABs | 6892 | 0.01563 | 108 | 1 |
| Altera Flex 10K | 13700 | 0.26 | 3562 | 33 |
| Xilinx 4000 | 4700 | 1.14 | 4560 | 42 |

(all figures include transistors for logic, configuration and signal routing)

This saving is largely due to the reductions in the reconfigurable interconnect required, which normally dominates the die area of a typical FPGA.

Block Size

This idea is easily extended to arbitrary block sizes. Although a design for a 8×8 block is given here, it would be trivial to extend the design to create any n by m block. The estimated transistor counts for the FAB and MFAB schemes if n by n blocks are used is given by:

$$MFAB_{tran} = 16n^2 + 154.5n + 120$$

$$FAB_{tran} = 29n^2 + 63n + 198$$

(This assumes that a fast carry-select adder scheme is used in the final column in both cases)

This demonstrates that the MFAB scheme uses fewer transistors than the FAB scheme for n>7, and that the saving from using MFAB blocks becomes larger the greater the size of the blocks used. Of course the larger the block size the more inefficiency will result for some multiplier sizes. (e.g. a 4×4 multiplier implemented in a 32×32 block is more inefficient than the same multiplier being implemented in a 8×8 block)

Integration into a Conventional FPGA Structure

We suggest using dedicated connections between the flexible blocks for the left, right, top, and bottom connections. The large number of metal layers now used in modern VLSI processes means that this can be done with little cost. Only the three inputs A7:0, B7:0, and Σ7:0, if used, with the output Q15:0 need to be routed to the reconfigurable interconnect, giving a total of 40 reconfigurable connections for each MFAB block.

Since the saving in silicon area has been estimated to be so significant (≈30 times), even if only 4% of the MFABs are used in the FPGA, there will be a net saving in silicon area when compared to the conventional FPGA architecture.

PUBLICATION REFERENCES

1. P M Athanas et al, "*Real-time image processing on a custom computing platform*", IEEE Computer, Vol. 28, No. 2, pp. 16–24, 1995
2. Altera Corporation, "*Ripple-carry adders in FLEX 8000 devices*", Application Brief 118, ver. 2, May 1994
3. O T Albaharna et al, "*On the viability of FPGA-based integrated coprocessors*", IEEE Symposium on FPGAs for Custom Computing Machines, Apr. 17–19 1996
4. O T Albaharna et al, "*Area & time limitations of FPGA-cased virtual hardware*", IEEE Proceedings International Conference on Computer Design: VLSI in Computers and Processors, pp. 184–189, 1994
5. K Hwang, "*Computer Arithmetic Principles, Architecture, and Design*", John Wiley & Sons, $1^{st}$ edn., pp. 194–197, 1979
6. C S Wallace, "*A suggestion for fast multiplier*", IEEE Trans. Electronic Computers, Vol. EC-13, pp. 14–17, February 1964
7. A D Booth, "*A signed binary multiplication technique*", Quarterly J. Mechan. Appl. Math., Vol. 4, Pt. 2, pp. 236–240, 1951
8. A R Baugh et al, "*A two's complement parallel array multiplication algorithm*", IEEE Trans. Computers, Vol. C-22, No. 1–2, pp. 1045–1047, December 1973
9. Xilinx, "*The Programmable Logic Data Book*", Version 1.02, Chapter 4, p.7, Jun. 1, 1996
10. L P Rubinfield, "*A proof of the Modified Booth Algorithm for Multiplication*", IEEE Trans. Computers, October 1975, pp1014–1015

What is claimed is:

1. A logic block. comprising:

an mxn array of partial calculating circuits comprising full-adders, where m≧2 and n≧2, operable to generate partial products of an m-bit multiplicand x n-bit multiplicand binary multiplication and a cumulative sum of the partial products for each bit of one multiplicand; and a configurable output circuit operable, under the control of a configuration signal, either (a) to sum the cumulative sums of partial products generated by the partial calculating circuits to generate a product value, or (b) to pass data representing the cumulative sums of the partial products to partial calculating circuits within one or more further logic blocks;

wherein those partial calculating circuits operable to generate a partial product involving a most significant bit of one multiplicand are selectively operable to invert bits of the other multiplicand.

2. The logic block according to claim 1, wherein at least some of the partial calculating circuits are operable to receive data passed from a preceding logic block representing cumulative sums of the partial products generated by that logic block.

3. The logic block according to claim 1, further comprising means for selectively adding a predetermined value to the cumulative sum of the partial products involving a most significant bit of one multiplicand.

4. The logic block according to claim 1, wherein the operation of at least one subset of the partial calculating circuits is configurable under the control of the configuration signal.

5. The logic block according to claim 4, wherein the operation of the partial calculating circuits is configurable under the control of the configuration signal.

6. The logic block according to claim 1, wherein the partial calculating circuits are arranged as a plurality of groups of circuits under the control of a respective decoder circuit, each decoder circuit being operable to decode p bits which are a subset of the bits of one multiplicand, where p≧2, and to control the groups of circuits to generate a value representing a partial product of the p bits of the one multiplicand with the other multiplicand.

* * * * *